(12) United States Patent
Kwan et al.

(10) Patent No.: US 7,553,727 B2
(45) Date of Patent: Jun. 30, 2009

(54) USING IMPLANTED POLY-1 TO IMPROVE CHARGING PROTECTION IN DUAL-POLY PROCESS

(75) Inventors: Ming-Sang Kwan, San Leandro, CA (US); Bradley Marc Davis, Mountain View, CA (US); Jean Yee-Mei Yang, Glendale, CA (US); Zhizheng Liu, San Jose, CA (US); Yi He, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 39 days.

(21) Appl. No.: 11/724,726

(22) Filed: Mar. 16, 2007

(65) Prior Publication Data

US 2008/0150006 A1    Jun. 26, 2008

Related U.S. Application Data

(60) Provisional application No. 60/876,180, filed on Dec. 20, 2006.

(51) Int. Cl.
*H01L 21/8247* (2006.01)

(52) U.S. Cl. .............................. 438/257; 257/E21.179
(58) Field of Classification Search ......... 438/257–267, 438/954; 257/E21.179
See application file for complete search history.

(56) References Cited

U.S. PATENT DOCUMENTS

| 6,362,049 | B1* | 3/2002 | Cagnina et al. | 438/258 |
| 6,372,577 | B1* | 4/2002 | Fang | 438/258 |
| 6,432,776 | B1* | 8/2002 | Ono | 438/275 |
| 2004/0241948 | A1* | 12/2004 | Nieh et al. | 438/287 |

* cited by examiner

*Primary Examiner*—Richard A. Booth
(74) *Attorney, Agent, or Firm*—Eschweiler & Associates, LLC

(57) ABSTRACT

The present invention pertains to implementing a dual poly process in forming a transistor based memory device. The process allows a first polysilicon layer to be selectively doped subsequent to deposition of the second polysilicon layer. The doping increases the conductivity of the first polysilicon layer which can achieve a more robust charging protection for multi-bit core array and a more uniform distribution of charge.

15 Claims, 17 Drawing Sheets

USING IMPLANTED POLY-1 TO IMPROVE CHARGING PROTECTION IN DUAL-POLY PROCESS

REFERENCE TO RELATED APPLICATION

This application claims the benefit of U.S. Provisional Patent Application Ser. No. 60/876,180 which was filed Dec. 20, 2006, entitled USING IMPLANTED POLY-1 TO IMPROVE CHARGING PROTECTION IN DUAL-POLY PROCESS.

FIELD OF INVENTION

The present invention relates generally to the art of semiconductor devices, and more particularly to electrostatic discharge (ESD) protection in dual-poly processing and to uniform charge distribution on a semiconductor substrate in the formation of flash memory devices.

BACKGROUND OF THE INVENTION

It is critical in semiconductor manufacturing and packaging to control wafer level core array threshold voltage (Vt) variation. This is especially true as electronic designs become smaller and more densely packed. In addition, charge can accumulate on a semiconductor surface if the surface is resistive to the point where a catastrophic breakdown or an Electrostatic discharge (ESD) event occurs. ESD events can damage, for example, semiconductors, the photoresist-masks or hard-masks, and the like. Electrostatic discharge can also produce electrical signals or electromagnetic interference (EMI) that interferes with the operation of equipment, such as, the production equipment. These ESD problems can occur, for example, throughout the semiconductor manufacturing and packaging process, including silicon wafer creation, photoresist-mask layering and etching, device manufacturing, and back-end processing, packaging and test. Many of these ESD problems persist through the entire "life" cycle of the semiconductor device. In addition, damage may be more subtle, for example, permanent alteration of the dielectric breakdown properties.

Implanted dopant ions, well known in the art, are electrically charged, a consequence of the ion implantation process. Charge imbalance related with ion implantation is attributed to a number of occurrences, for example, ejection of secondary electrons, discharge of other charged species from the wafer, absorption of ions from surrounding area, and the like. The charging properties or effects associated with ion implantation are difficult to model. Furthermore, the charge distribution will fluctuate over the surface of the wafer because of variations in the ion beam, the variable characteristics of the wafer surface, surface areas with different conductivities, excess charge already present on the wafer, and the like. Charge distributions vary over the surface of a wafer, from wafer to wafer, etc. All of these factors contribute to non-uniform charge distributions on the wafer surface which can have serious consequences on semiconductors devices that are continuously being reduced in size.

Semiconductor manufacturing technologies will continue to move toward smaller device geometries in the foreseeable future and acceptable ESD levels will continue to decrease with decreasing device dimensions, as well as the need for uniform charge distributions. The use of integrated passive substrate components (e.g., resistors, inductors, capacitors, etc.) offers ESD discharge and charge distribution advantages in semiconductor packaging efficiency, miniaturization, performance, manufacturing, and processing. Decoupling capacitors, for example, act as charge reservoirs and suppress charge buildup and ESD events, promote uniform charge distributions, and the like, by directing charge away from the core array of a flash memory, for example, yet these devices can be expensive to implement in the fabrication process.

Thus, there is a need to provide a method which improves the conductivity associated with the poly-1 deposition but which does not suffer from the problems that are currently present with processes employing integrated passive components.

SUMMARY OF THE INVENTION

The following presents a simplified summary in order to provide a basic understanding of some aspects of the invention. This summary is not an extensive overview of the invention. It is intended to neither identify key or critical elements of the invention nor to delineate the scope of the invention. Rather, the primary purpose of this summary is to present some concepts of the invention in a simplified form as a prelude to the more detailed description that is presented later.

The semiconductors typically employ a solid crystalline material, for example, germanium, silicon, and the like that have an electrical conductivity greater than insulators but less than good conductors. Therefore, when the poly-1 in a dual-bit flash memory process is not yet doped the resistance of the poly-1 is high and as such the poly-1 can not effectively transfer charge buildup to a passive integrated component or charge mitigation device, such as an LV (low voltage) capacitor, for example.

The present invention pertains to implementing a dual poly process in forming a transistor based flash memory device. The process utilizes doping the poly-1 prior to poly-2 deposition with or without masking. The doped poly-1 can be utilized to improve the conductivity of the poly-1 layer so that excess charge can be directed to a passive integrated component, for example, a low voltage capacitor, and the like during subsequent processing.

The present invention according to one or more aspects pertains to a method to achieve a lower poly resistance, which in turn helps to achieve a more robust charging protection for multi-bit core array.

According to one or more aspects of the present invention, a method of doping at least a portion of the poly-1 layer upon a semiconductor substrate is disclosed in order to decrease the resistance of the poly-1 layer during the initial stages of the process. An ESD event or non-uniform charge distribution can take place prior to doping due to electrical charge building up on the substrate and having no pathway to be safely discharged. The method includes doping at least a portion of the poly-1 layer concurrent with or prior to the poly-2 deposition. The deposition can be employed utilizing masking prior to the initial poly-1 doping process or masking after the poly-1 doping.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
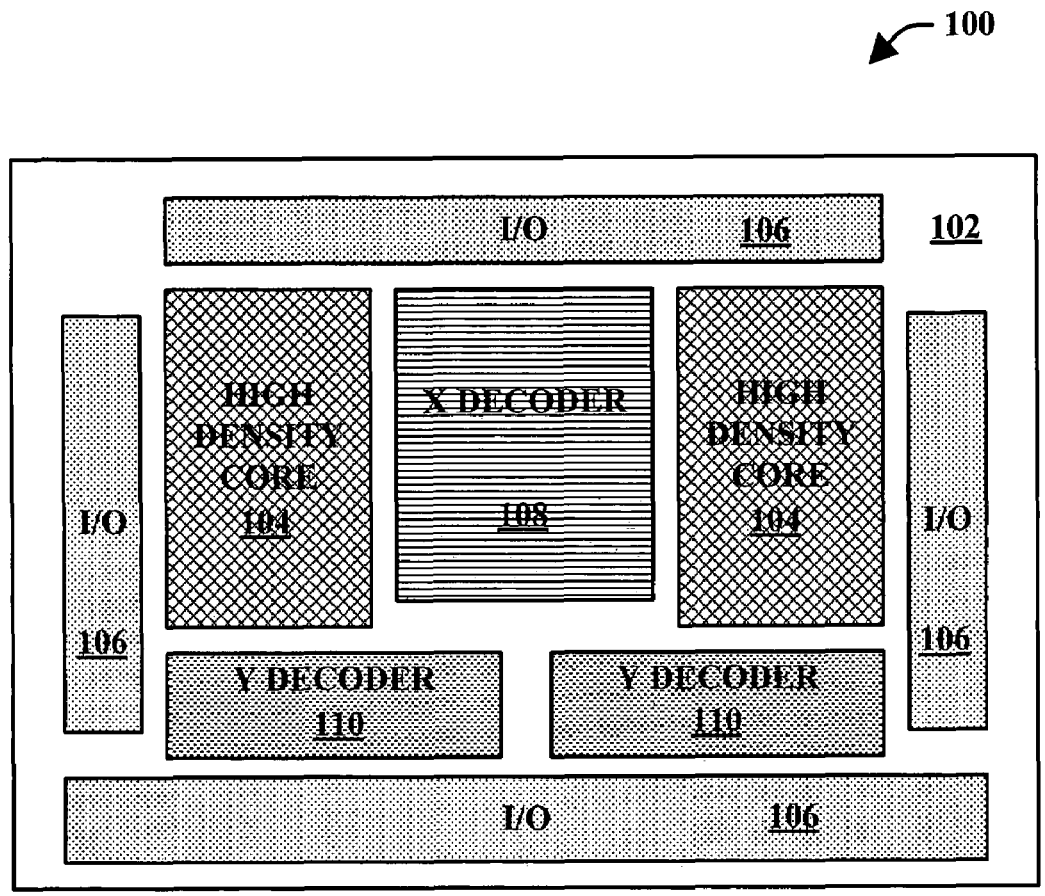
FIG. 1 is a top view of a dual bit flash memory device.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram or other form in order to facilitate describing one or more aspects of the present invention.

The present invention pertains to implementing a dual poly (polysilicon) process in forming a transistor based flash memory device. The process employs utilizing a poly-1 doping process concurrent with or prior to the poly-2 deposition process. The doping process, as mentioned supra, can be performed with or without a masking process performed prior to the doping process. The process facilitates a more uniform charge distribution and a reduction in ESD events allowing more semiconductors to be manufactured and processed without failure, for example. As a result, more devices can be manufactured in a given time frame with a higher yield. In addition the process allows semiconductor devices, for example, flash memory to be manufactured with a more uniform charge distribution resulting in more uniform properties, and the like.

In the prior art processes the poly-1 was not doped until after the poly-2 was deposited. The inventors recognized the advantages of doping the poly-1 layer concurrent with or prior to the poly-2 deposition. Those advantages include 1) distributing process induced charges uniformly throughout the core array structures by reducing the poly-1 resistance, and 2) more overall uniform poly-1/poly-2 doping by the end of processing.

Referring initially to FIG. 1, a top view of an exemplary dual bit flash EEPROM 100, for example, is illustrated. The memory 100 generally incorporates a semiconductor substrate 102 in which one or further high-density core regions 104 and one or more lower-density peripheral portions are formed. The high-density core regions characteristically include one or more M by N arrays 104 of individually addressable, substantially identical dual bit flash memory cells. The lower-density peripheral portions on the other hand typically include input/output (I/O) circuitry 106 and programming circuitry for selectively addressing the individual memory cells. The programming circuitry is represented in part by and includes one or more x-decoders 108 and one or more y-decoders 110 that collaborate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
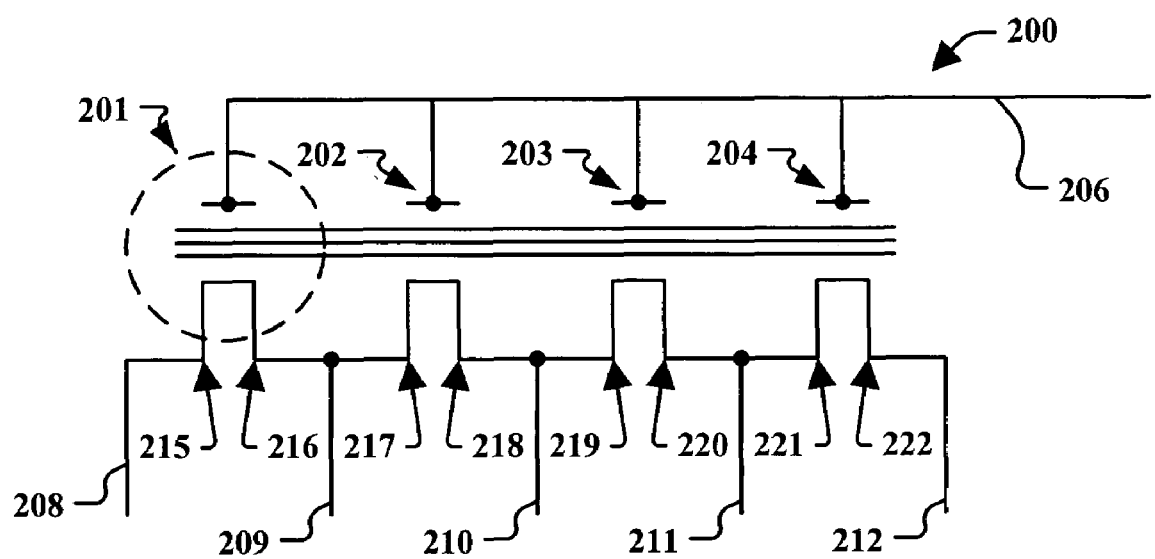
FIG. 2 is a schematic illustration of a portion of a wordline of a memory core such as may include at least part of one of the cores depicted in FIG. 1.

Turning to FIG. 2, a schematic illustration is presented of a portion 200 of a memory core such as may include at least part of one of the M by N array cores 104 depicted in FIG. 1. The circuit schematic shows a line of memory cells, which includes memory cells 201 through 204 in a virtual ground type implementation, for example. The respective memory cells 201 through 204 are connected to a wordline 206, which serves as a control gate, and pairs of the memory cells share a common bitline. For instance, in the example shown, the memory cell 201 has associated bitlines 208 and 209; the memory cell 202 has associated bitlines 209 and 210; the memory cell 203 has associated bitlines 210 and 211; and the memory cell 204 has associated bitlines 211 and 212. As such, cells 201 and 202 share bitline 209, cells 202 and 203 share bitline 210 and cells 203 and 204 share bitline 211, respectively.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. It will be appreciated that although adjacent memory cells share common bitlines, the adjacent memory cells do not interfere with each other because the memory cells are typically programmed one at a time and in such instances only one memory cell is active at a time while programming.

Figure 3:
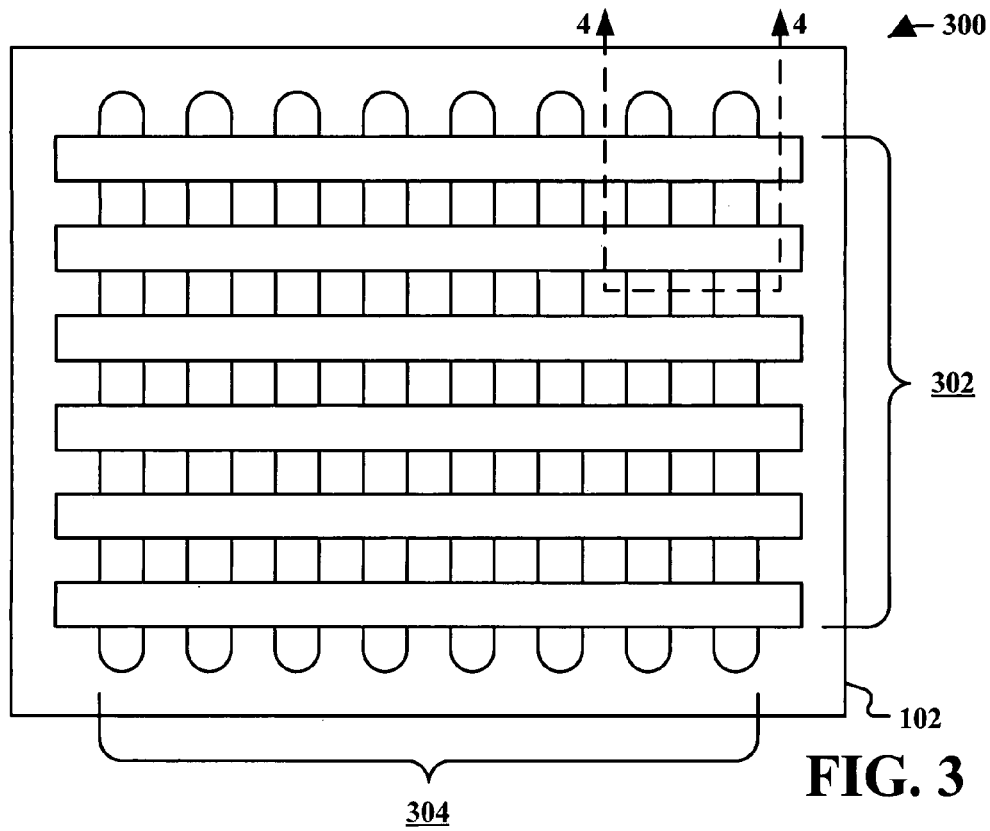
FIG. 3 is a top view of at least a portion of a memory core, such as may include at least part of one of the cores depicted in FIG. 1.

Referring now to FIG. 3, a top view is presented of at least a portion 300 of a memory core, such as may include at least part of one of the M by N array cores 104 depicted in FIG. 1. The memory 300 is formed upon a semiconductor substrate 102 and has a plurality of implanted bitlines 304 extending substantially parallel to one another, and further includes a plurality of formed wordlines 302 extending substantially in parallel to one another and at substantially right angles to the plurality of implanted bitlines 304. It will be appreciated that the wordlines 302 and bitlines 304 have contacts and interconnections (not shown) to programming circuitry such as may be represented, at least in part, by the x-decoders 108 and y-decoders 110 depicted in FIG. 1.

Figure 4:
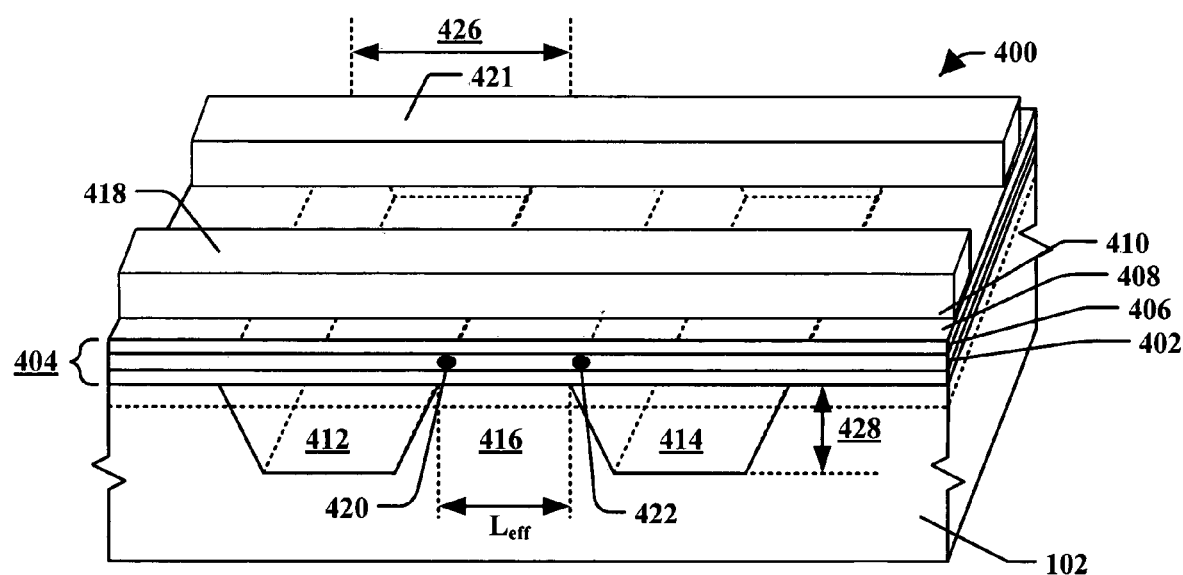
FIG. 4 is a cross-sectional isometric illustration of a portion of a dual bit flash memory, such as that taken along line 4-4 of FIG. 3.

FIG. 4 is a cross-sectional isometric prior art illustration of a portion 400 of a dual bit flash memory, such as that taken along line 4-4 of FIG. 3. A semiconductor substrate 102 upon which the memory is formed is doped with a p-type impurity such as boron, for example, to establish a threshold adjustment implant ($V_{tadjust}$) region 402 therein. The threshold adjustment implant provides a region 402 that is more heavily doped than the semiconductor substrate 102. The substrate can, for example, be formed out of silicon and can itself be doped with a p-type impurity. The threshold adjustment implant 402 assists in controlling a threshold voltage of the various cells within the memory 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are typically formed of an oxide dielectric such as silicon dioxide ($SiO_2$) and the charge-trapping layer 408 is generally formed of a nitride dielectric such as silicon nitride ($Si_xN_y$). The oxide-nitride-oxide configuration is commonly referred to as an ONO layer for convenience. Alternatively, other types of charge-trapping layers may be employed and are contemplated as falling within the scope of the present invention.

First and second conductive bitlines 412 and 414 are depicted in FIG. 4 underlying the charge trapping dielectric layer 404. It will be appreciated that any number of such bitlines can be implanted into the semiconductor substrate 102, and that such bitlines may correspond to the bitlines 304 depicted in FIG. 3. The bitlines are typically formed of an implanted n-type material, such as arsenic, and may include an oxide portion (not shown) in some examples. The first and second conductive bitlines 412 and 414 are spaced apart and define a channel region 416 there-between.

First and second conductive wordlines 418, 419 are similarly depicted overlying the charge-trapping dielectric layer 404. It will be appreciated that any number of such wordlines can be formed over the dielectric layer 404, and that such wordlines may correspond to the wordlines 302 depicted in FIG. 3. The wordlines can be formed out of a polysilicon material, for example, where the polysilicon material may be deposited over the dielectric layer 404 and then patterned and etched.

Locations 420 and 422 indicate generally where respective bits of data can be stored in one or the cells of the memory 400. It will be appreciated that the channel 416 has an effective length $L_{eff}$ and that the bits 420, 422 will be brought closer together as this length is reduced (e.g., as a result of scaling). As such, the bits themselves may interfere with and/or contaminate one another and operations performed on one bit may affect the other bit should the bits get too close to one another. In addition, if the charge on the conductive wordlines, 418, 419 is non-uniform this can potentially result in errors in storing, reading and erasing of bits in the flash memory.

Figure 5A:
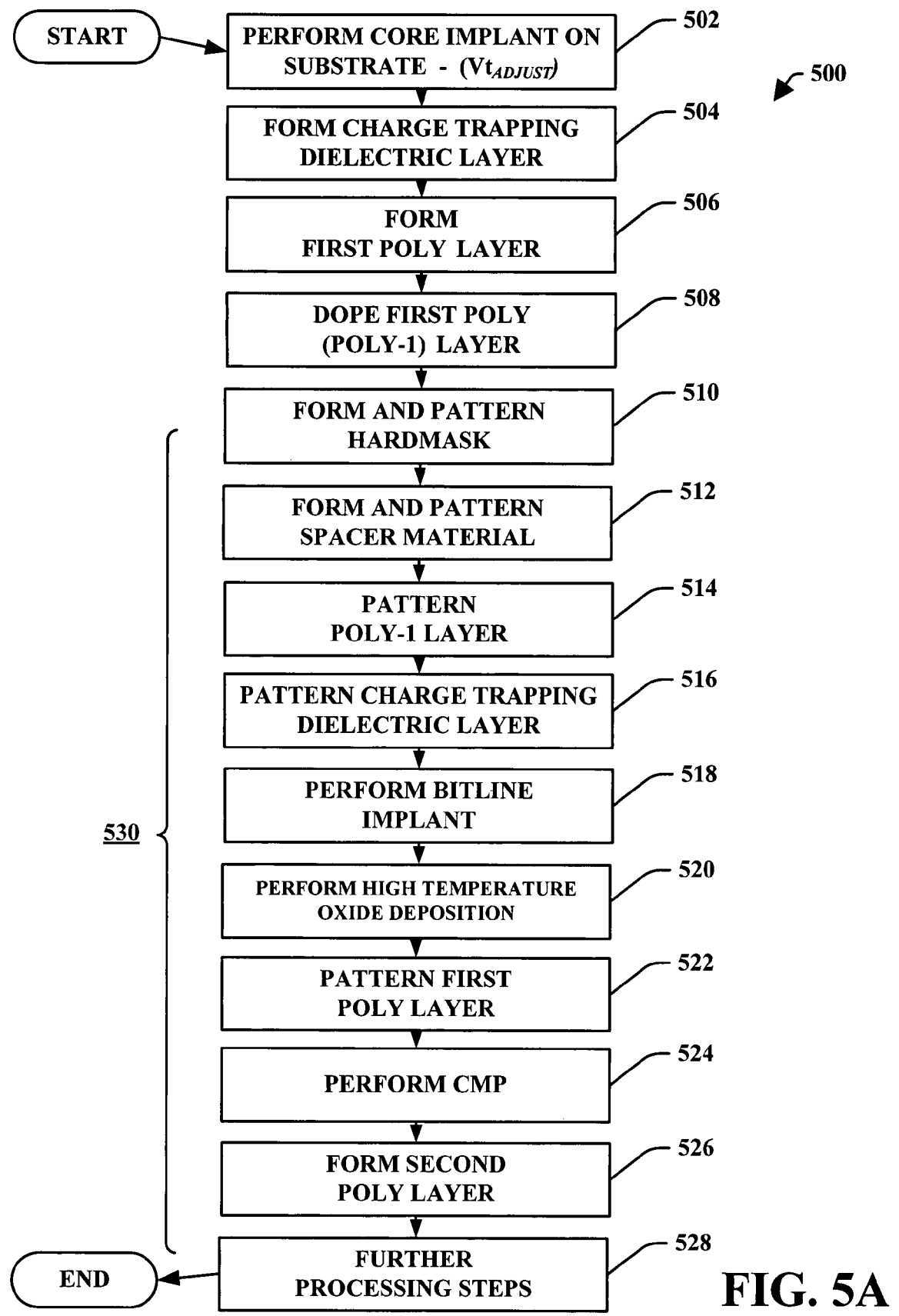
FIG. 5A is a flow diagram illustrating an example of a methodology for forming a memory device in accordance with one or more aspects of the present invention wherein a poly-1 layer is doped prior to or concurrent with the poly-2 deposition either with or without masking employed prior to the doping process.
Figure 5B:
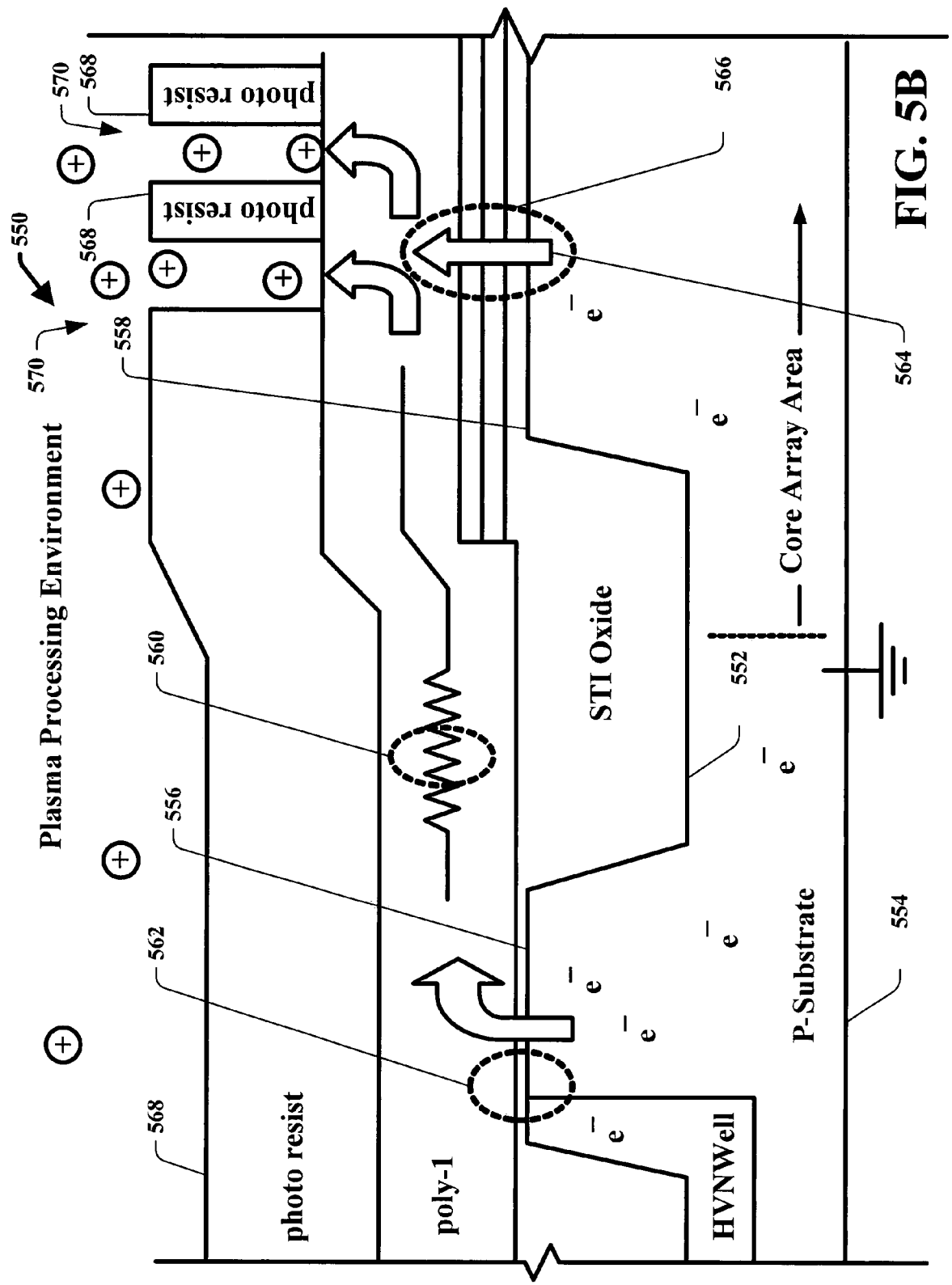
FIG. 5B is an illustration of the poly-1 process, according to an aspect of the present invention.

Turning to FIG. 5A, a methodology 500 is illustrated for forming a memory device according to one or more aspects of the present invention. In particular, the memory can be formed with a dual poly process employing doping of the poly-1 layer concurrent with or prior to the deposition of the poly-2 layer. The doping of the poly-1 layer may take place with or without masking the poly-1 surface prior to the doping process. The memory device so formed can, for example, correspond to a portion of a memory core such as may include at least part of one of the M by N array cores depicted in FIG. 1.

Although the methodology 500 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated acts may be required to implement the methodology in accordance with one or more aspects of the present invention. Further, one or more of the acts may be carried out in one or more separate acts or phases.

It will be appreciated that the methodology carried out according to one or more aspects of the present invention may be implemented in association with the formation and/or processing of structures illustrated and described herein as well as in association with other structures not illustrated or described herein. By way of example, the method or variants thereof may be used to fabricate a dual bit memory as illustrated and described below with respect to the figures, as well as to devices not shown or described herein.

The memory is formed upon a semiconductor substrate at 502, and a threshold adjustment core implant $Vt_{adjust}$ can be performed to establish a region of the substrate that is more heavily doped than the remainder of the semiconductor substrate. The substrate can, for example, be formed out of silicon and can itself be doped with a p-type impurity such as boron, for example. The threshold adjustment implant may include a greater concentration of and/or a higher energy implant of the same or different p-type dopant utilized in the rest of the substrate, for example, and assists in controlling a threshold voltage of the memory cell. In addition, shallow trench isolation (STI) can be formed, for example, in the substrate. It is to be appreciated that the formation and/or fabrication of STI is well known to those of ordinary skill in the art.

At 504 a charge trapping dielectric layer is formed over the semiconductor substrate. The charge trapping dielectric layer may be a multilayer material that may include a first insulating layer, a charge-trapping layer, and a second insulating layer. The first and second insulating layers may be formed of an oxide dielectric such as silicon dioxide ($SiO_2$), for example. The first insulating layer can be formed to a thickness of about 70 Angstroms or less, for example, while the second insulating layer can be formed to a thickness of about 100 Angstroms or less, for example. The charge-trapping layer may be formed of a nitride dielectric such as silicon nitride ($Si_xN_y$), for example, and may be formed to a thickness between about 60 to 80 Angstroms, for example. The oxide-nitride-oxide configuration is commonly referred to as an ONO layer for convenience. Alternatively, poly-islands or other types of charge trapping dielectrics may be formed in accordance with one or more aspects of the present invention. A first layer of poly (polysilicon) based material(s) is then formed over the charge trapping dielectric layer at 506. This first poly layer (poly-1) can be formed to a thickness of between about 900 to 1100 Angstroms, for example.

At 508 the first layer of polysilicon (poly-1, also known as polysilicon-1) can be doped in order to reduce the resistivity of the poly-1. The poly-1 can be doped, for example, utilizing diffusion, in situ doping, ion implantation, and the like. Diffusion doping comprises, for example, depositing a heavily-doped silicon glass over the poly-1 with the glass serving as the source of dopant for the poly-1. The dopant diffusion can take place at a temperature of, for example, 900-1000 deg. C. Ion implantation comprises directly bombarding the poly-1 layer with high-energy ions, for example, while in situ doping employs dopant atoms that are established in the semiconductor during its growth, commonly during epitaxial growth of semiconductor layers, for example. In the case of using ion implantation to dope the poly-1, beside blanket implantation, an implantation mask can also be used to achieve doping to selected area and other techniques known by those of ordinary skill in the art.

A layer of hardmask material can be subsequently formed over the poly-1 formation or deposition at 510. An optional antireflective coating (ARC) layer (e.g., of an organic material, such as silicon nitride or silicon oxynitride) can also be formed over the hardmask, and a resist can be formed over the ARC layer to facilitate patterning the hardmask. The ARC layer in particular can assist with mitigating reflection during exposure and thereby improves the fidelity of pattern transfer. The hardmask can, for example, be formed from oxide based material(s) that are applied to a thickness of between about 300 to 700 Angstroms, for example. The spacings within the hardmask can be formed to have respective widths of between about 100 to 140 nanometers, for example.

At 512 a layer of spacer material (e.g., oxide based material) is formed over the patterned hardmask. The spacer material can be formed to a thickness of between about 200 to 500 Angstroms, for example, and is utilized to form spacers that assist with establishing narrower buried bitlines. As such, the spacer material is then patterned (e.g., isotropically etched) at 512 to form sidewall spacers adjacent the patterned features of the hardmask, thereby reducing respective spacings between the hardmask features. The spacers can be formed to have respective widths of between about 20 to 40 nanometers, for example. The distance between the spacers defines respective bitline openings having widths somewhere in the neighborhood of around 55 to 85 nanometers, for example. It will be appreciated that should an ARC layer be utilized in patterning the hardmask, the ARC layer would also be patterned and would add to the thickness of the oxide sidewall spacers and would contribute to narrowing the respective bitline openings.

The poly-1 is then patterned at 514. The sidewall spacers serve as guides and as such, spacings formed within the poly-1 can have respective widths corresponding to that of the bitline openings. The charge trapping dielectric layer can be similarly patterned at 516 to include spacings having respective widths corresponding to that of the bitline openings. It will be appreciated that the etchants utilized to remove the first and second dielectric layers can also be effective to remove the patterned hardmask features and the sidewall spacers since these features contain the same or a similar type of compound, namely an oxide. Should some traces of the hardmask features remain, these can be stripped or washed away at a later appropriate time.

A bitline implant can then, for example, be performed at 518 to establish the buried bitlines within the exposed semiconductor substrate. The bitline implant can include an n-type dopant, such as Arsenic, for example. In one example, the bitlines are formed to a width of about 70 nanometers. A high temperature oxide deposition can then be performed at 520 to fill in the respective spacings formed within the charge trapping dielectric layer. The high temperature oxide deposition can be performed at temperatures between around 700 to 1200 degrees Celsius, for example. The high temperature oxide deposition can cause oxide growth over the respective bitlines while also depositing oxide over the buried bitlines. In one example, about 100 Angstroms of an oxide is grown, while an additional, approximately 100 Angstroms, of an oxide is deposited over the bitlines.

A high density plasma (HDP) deposition can be performed (not shown) to fill in the respective spacings formed within the poly-1 with an oxide material. The HDP deposition can, for example, be performed at a temperature of about 300° C. to about 700° C. under a pressure, for example, of about 1-10 mTorr to fill in the first poly spacings. The entire wafer can then be subjected to chemical mechanical polishing (CMP) at 524 to remove any excess oxide and planarize the surface of the structures thereon.

At 526 a second layer of poly based material(s) can, for example, then be formed over the poly-1. As with the poly-1, this second poly layer (poly-2) can be formed (not shown) to thickness of between about 900 to 1100 Angstroms, for example. The second poly layer (poly-2) can serve as a wordline material and as such can be patterned into wordlines. Accordingly, the second poly layer can be patterned to establish wordlines over the buried bitlines (e.g., at a substantially 90 degree orientation). The methodology may then continue on for further processing at 528. In addition, processes 510-528 and acts beyond 528 can be referred to as back end processing 530 and can be carried out in numerous ways.

Turning now to FIGS. 5B-20, FIG. 5B illustrates a schematic diagram of at least a portion of a memory device at 550, according to another aspect of the present invention. An STI (shallow trench isolation) trench 552 is shown formed in the substrate 554, surrounded on either side by a source/drain 556 and with patterned photoresist 568. A preferred thin oxide capacitor current leakage path 562 by design is illustrated, which supports the discharge of incoming positive charges from the plasma processing environment. The poly-1 is doped in the area 570 where there is no photoresist 568, for example. The current leakage path in the poly-1 can be very resistive without doping of the poly-1. In the situation where the poly-1 is very resistive, an un-wanted current leakage path 564 will become the only or the dominant discharge path. As a result, the core ONO layer 566 will become charged. Doping the poly-1 connection region 560 to reduce poly-1 resistivity will minimize leakage through the core ONO layer 566, and help to avoid excessive changing of the core ONO layer 566.

Figure 6:
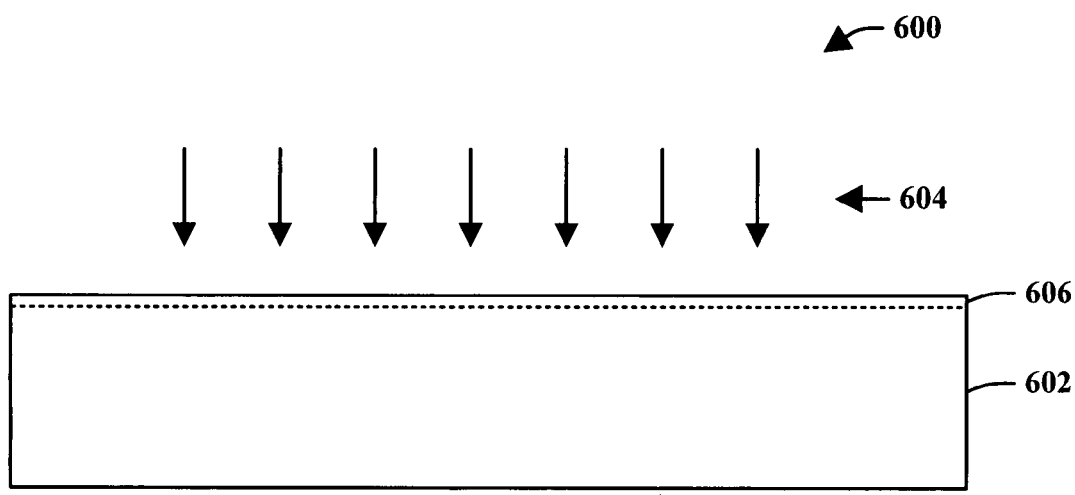
FIGS. 6-20 are cross-sectional illustrations of memory formed according to one or more aspects of the present invention.

FIG. 6 illustrates an exemplary technique for forming a memory device 600 according to one or more aspects of the present invention is disclosed. In particular, the memory 600 is formed utilizing dual poly layers (e.g., poly-1 and poly-2) wherein the poly-1 can be doped early on in the process. The doping of the poly-1 layer, early in the process has several advantages: 1) distributing process induced charges uniformly throughout the core array structures by reducing the poly-1 resistance, and 2) a more overall uniform poly-1/poly-2 doping by the end of processing. The memory device 600 so formed may, for example, correspond to a portion of a memory core such as may include at least part of one of the M by N array cores depicted in FIG. 1.

Initially, a semiconductor substrate 602 upon which the memory is formed can be subjected to a threshold adjustment implant 604 to establish a region 606 of the substrate 602 that is more heavily doped than the remainder of the semiconductor substrate (FIG. 6). The substrate may itself be doped with a p-type dopant such as Boron, for example, and the threshold adjustment implant ($V_{tadjust}$) may include a greater concentration of and/or a higher energy implant of the same or different p-type dopant, for example. The threshold adjustment implant 604 assists in controlling a threshold voltage of the memory device 600. The threshold adjustment implant, however, is optional and may be skipped in accordance with the present invention.

It is to be appreciated that reference to substrate or semiconductor substrate as used herein can include a base semiconductor wafer (e.g., silicon, SiGe, or an SOI wafer) and any epitaxial layers or other type semiconductor layers formed thereover or associated therewith. It is to be further appreciated that elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

Figure 7:
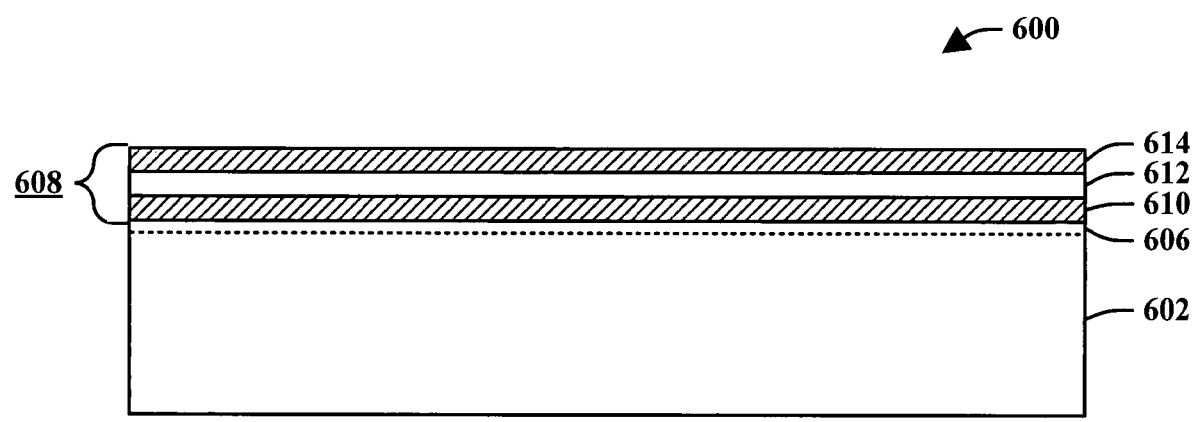

A charge trapping dielectric layer 608 is then formed over the semiconductor substrate 602 (FIG. 7). In the example shown, the charge trapping dielectric layer 608 includes a first insulating layer 610, a charge trapping layer 612 and a second insulating layer 614. The first insulating layer 610 can be formed to a thickness of about 70 Angstroms or less, for example, while the second insulating layer 614 can be formed to a thickness of about 100 Angstroms or less, for example. Both the first and second insulating layers can include, for example, silicon dioxide. The charge-trapping layer 612 may be formed of a nitride dielectric such as silicon nitride ($Si_xN_y$), for example, and may be formed to a thickness between about 60 to 80 Angstroms. The oxide-nitride-oxide configuration is commonly referred to as an ONO layer for convenience. Alternatively, poly-islands or other types of charge trapping dielectrics may be formed in accordance with one or more aspects of the present invention.

Figure 8:
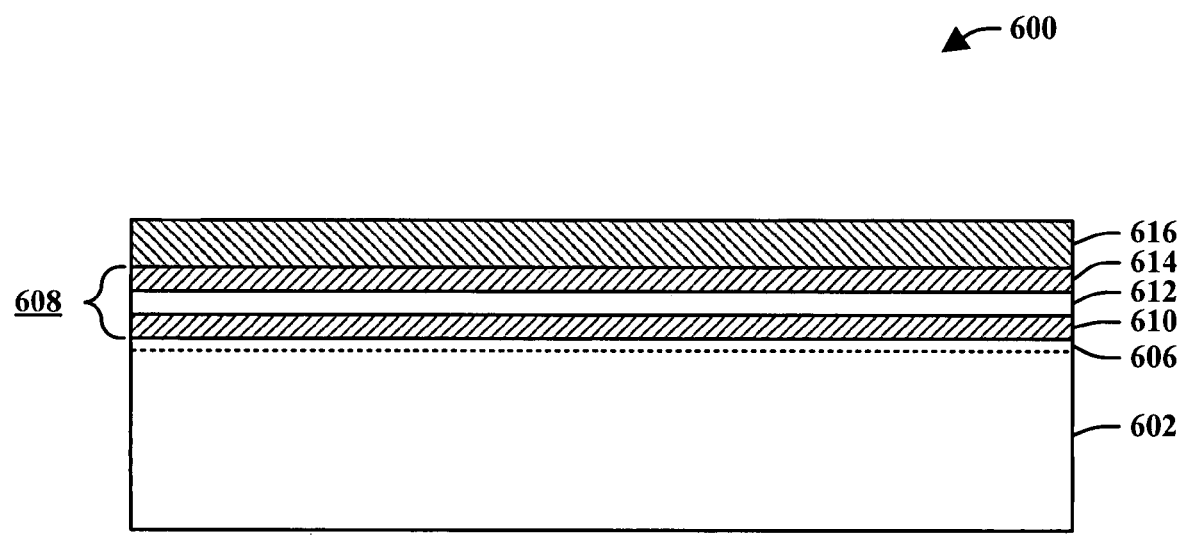

A first layer of poly based material(s) (poly-1) 616 can then be formed over the charge trapping dielectric layer 608 (FIG. 8). This first poly layer 616 can be formed to a thickness of between about 900 to 1100 Angstroms, for example. The first layer or poly-1 layer can be doped 604 or implanted, as in FIG. 9A, to improve the conductivity of the poly-1 for directing charges to, for example, a passive charge storage device, such as, a low voltage capacitor. The poly-1 layer can be formed (FIG. 9A), where the doping 604 includes, for example, an n-type dopant. In another embodiment of the present invention doping is performed at an energy level of around 5 KeV to 15 KeV. In yet another embodiment of the present invention, a doping or implantation can be performed at a dosage of around $1 E14/cm^2$ to $1E15/cm^2$ wherein the dopant concentration can be about $2E20/cm^3$ or less.

Figure 9A:
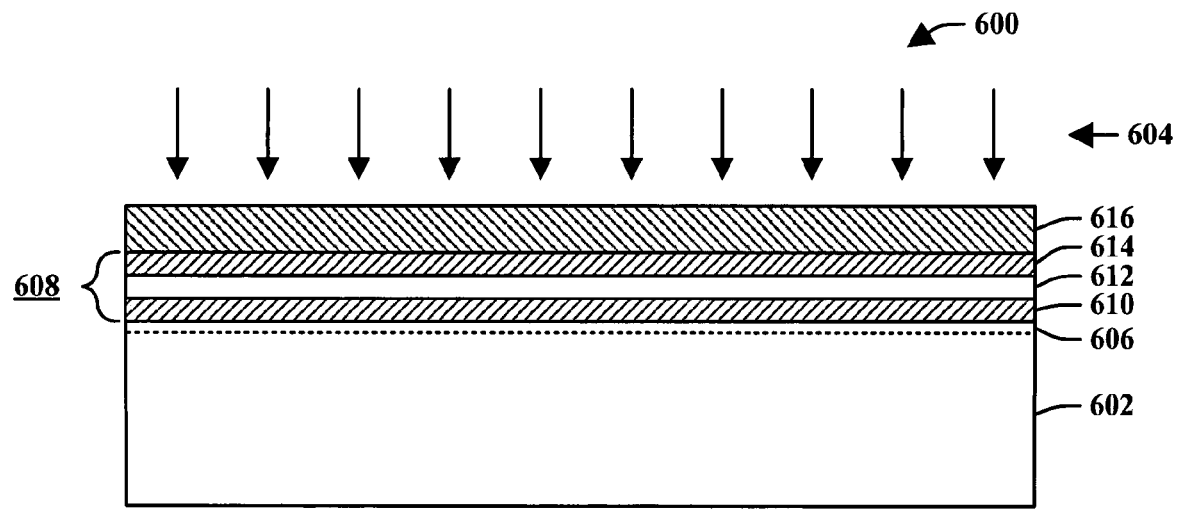
Figure 9B:
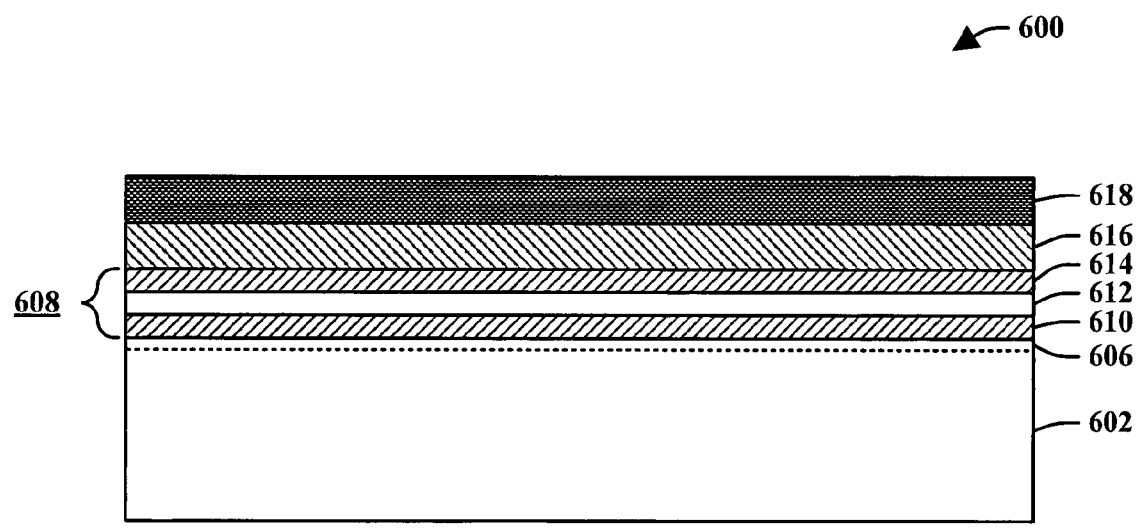

A layer of hardmask material 618 can be subsequently formed over the first poly layer 616 (FIG. 9B). An optional antireflective coating (ARC) layer (not shown) that may include an organic material, such as silicon nitride or silicon oxynitride, for example, can be formed over the hardmask 618, and a resist (also not shown) can be formed over the ARC layer to facilitate patterning the hardmask 618. The ARC layer in particular assists with mitigating reflection during exposure and thereby improves the fidelity of pattern transfer. The hardmask 618 can, for example, be formed from oxide based material(s) that are applied to a thickness of between about 300 to 700 Angstroms, for example.

Figure 10:
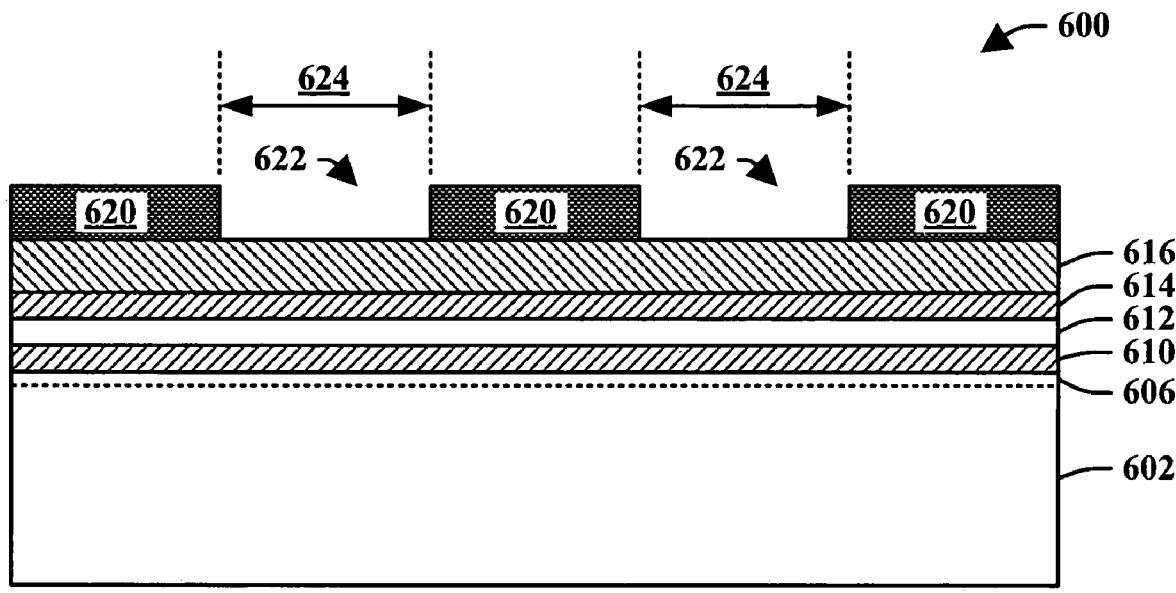

The hardmask 618 can then be patterned (e.g., after both the resist and optional ARC layers have been patterned, exposed, etched and/or selectively stripped to form a combined photomask for transferring the pattern onto the hardmask) (FIG. 10). The resulting hardmask features 620 formed (e.g., etched) from the hardmask 618 correspond, at least partially, to buried bitlines which will be formed within the substrate 602. More particularly, respective spacings 622 between the features 620 correspond somewhat to buried bitlines that will be implanted within the substrate 602. The spacings 622 within the hardmask 618 can be formed to have respective widths 624 of between about 100 to 140 nanometers, for example.

Figure 11:
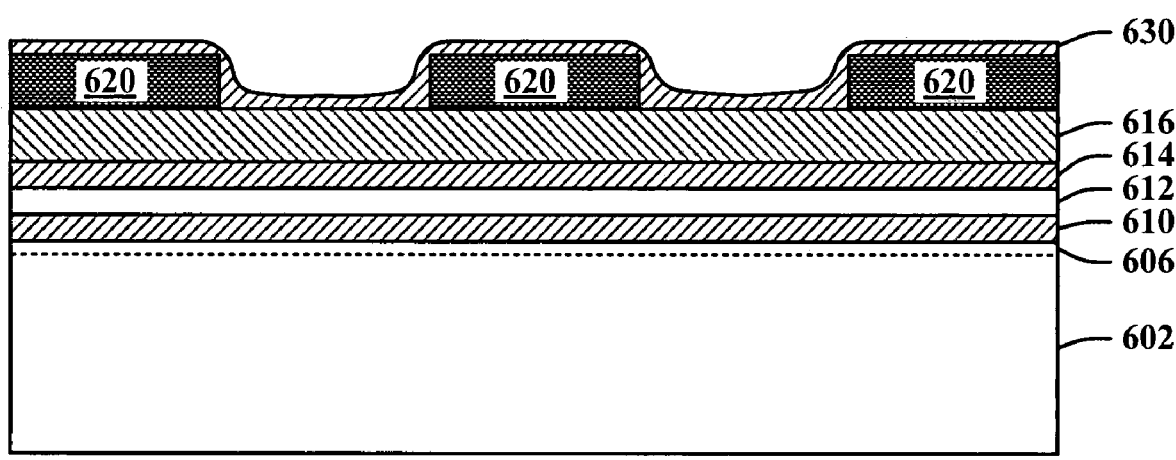
Figure 12:
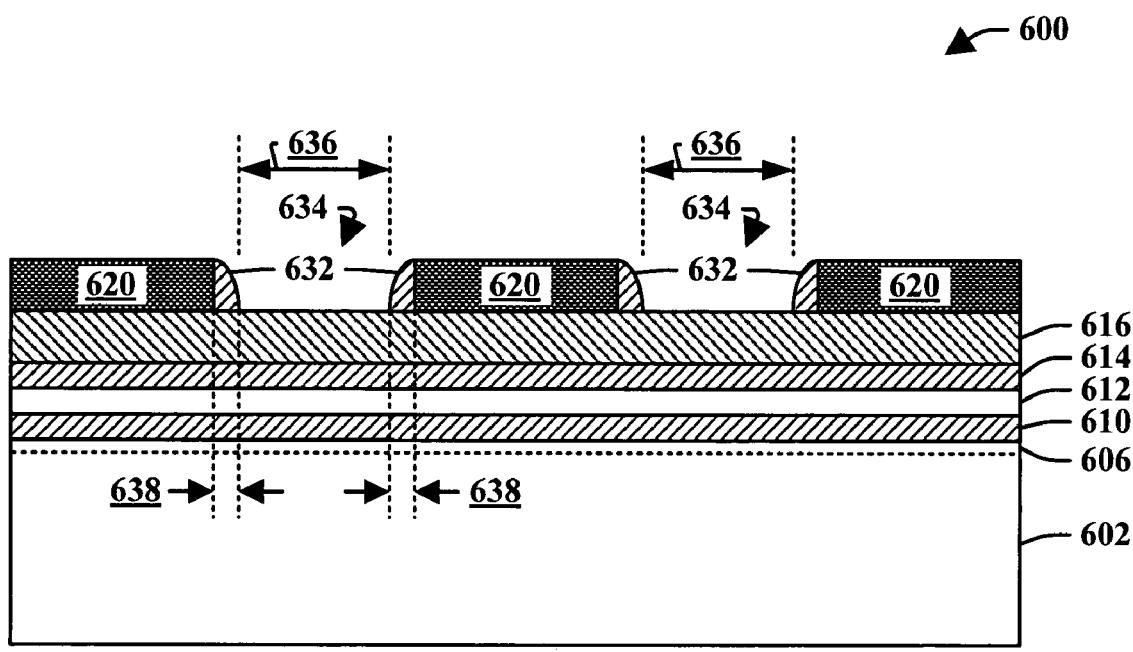

An optional layer of spacer material 630 (e.g., of oxide based material(s)) can then be formed over the patterned hardmask features 620 and exposed portions of the poly-1 layer 616 (FIG. 11). The spacer material 630 can be formed to a thickness of between about 200 to 500 Angstroms, for example, and is utilized to form spacers that assist with establishing narrower buried bitlines. As such, the spacer material 630 is then patterned (e.g., isotropically etched) to form sidewall spacers 632 adjacent to the patterned features 620 of the hardmask (FIG. 12). The distance between the spacers 632 defines respective bitline openings 634 having widths 636 somewhere in the neighborhood of around 55 to 85 nanometers, for example. The sidewall spacers can have respective widths 638 of between about 20 to 40 nanometers, for example. It will be appreciated that should an ARC layer be utilized in patterning the hardmask 618, the ARC layer would also be patterned and would add to the thickness of the sidewall spacers 632 and thus would contribute to narrowing the respective bitline openings 634.

Figure 13:
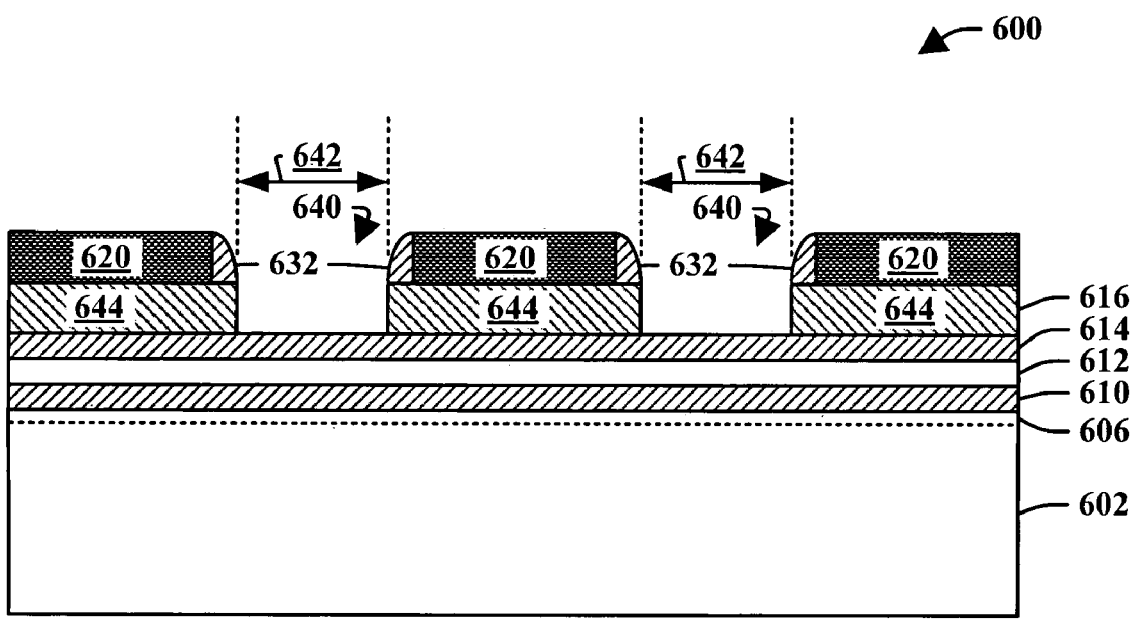
Figure 14:
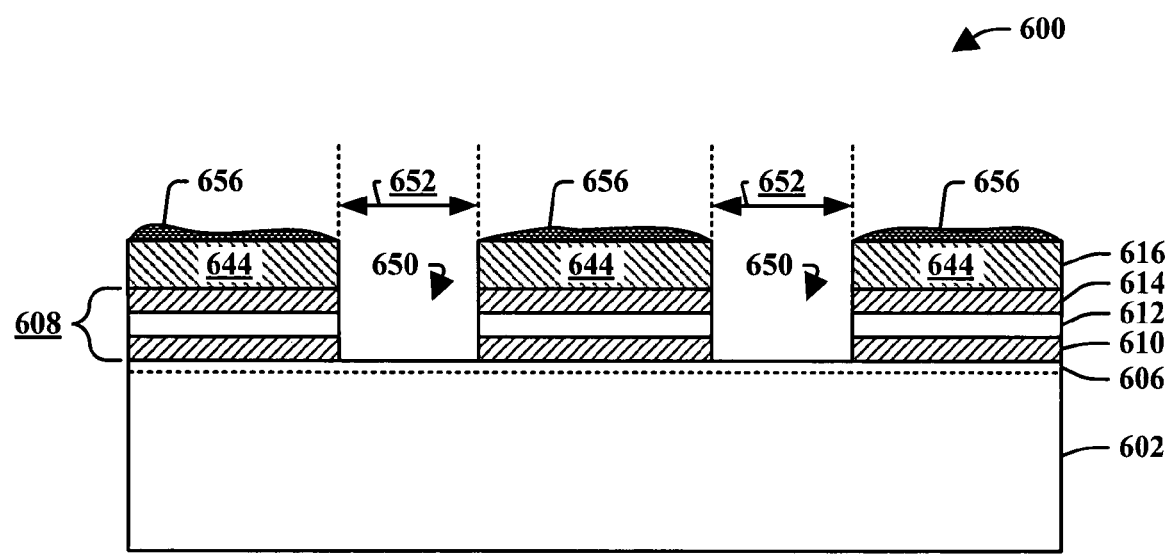
Figure 15A:
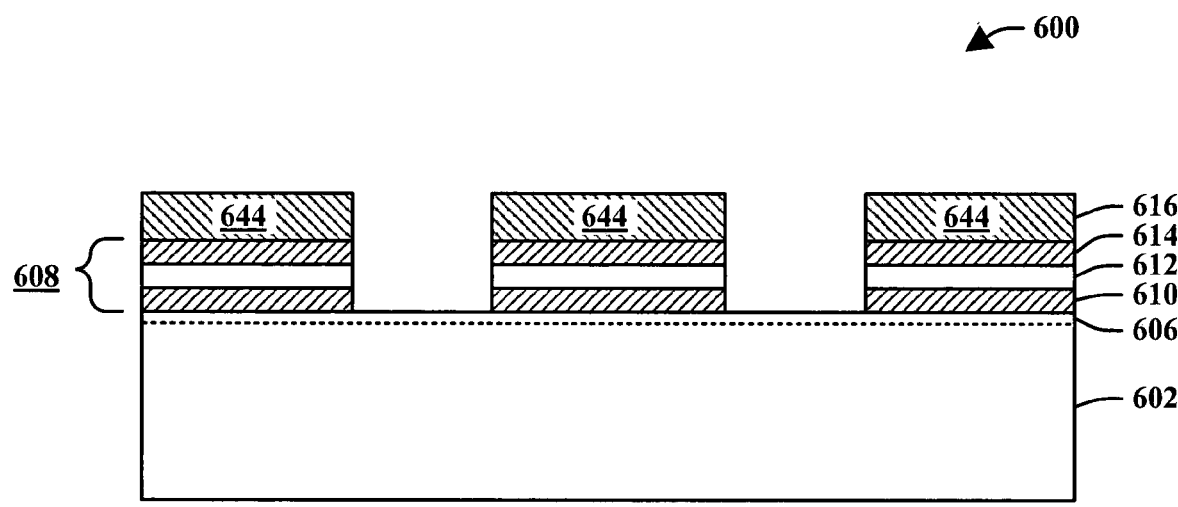

The poly-1 layer 616 is then patterned with the sidewall spacers 632 serving as guides (FIG. 13). As such, spacings 640 formed within the first poly layer 616 can have respective widths 642 corresponding to the widths 636 of the bitline openings 634 (FIG. 12). It will be appreciated that in a three dimensional perspective the first poly layer 616 is patterned into parallel "strips" 644 of first poly material 616. The charge trapping dielectric layer 608 is similarly patterned (FIG. 14) to include spacings 650 having respective widths 652 also corresponding to that 636 of the bitline openings 634 (FIG. 12). It will be appreciated that the etchants utilized to remove the first 610 and second 614 dielectric layers can also be effective to remove the patterned hardmask features 620 and the sidewall spacers 632 (FIG. 13) since these features contain the same or a similar type of compound, namely oxide based materials. Should some traces 656 of the hardmask features remain (FIG. 14), these can be stripped or washed away at a later time to reveal a clean patterned poly-1 layer 644 (FIG. 15A).

Figure 15B:
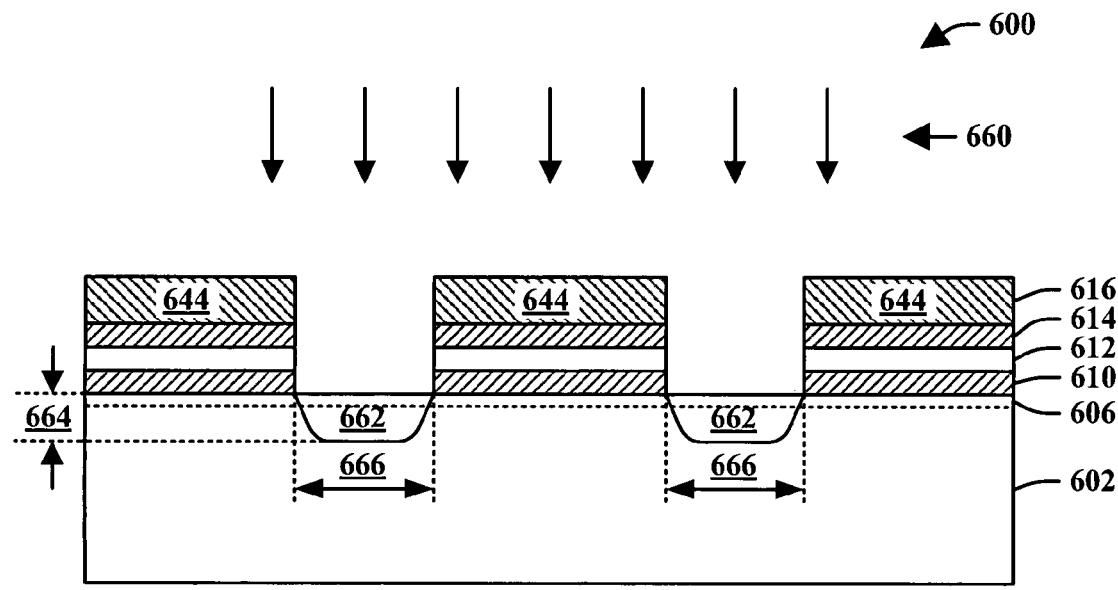

A bitline implant 660 can be performed to establish the buried bitlines 662 within the semiconductor substrate 602 (FIG. 15B). The bitline implant 660 can include an n-type dopant, such as Arsenic, for example. Similarly, the bitlines 662 can be formed to relatively shallow depths 664 of between about 300 to 500 Angstroms (428, FIG. 4). Additionally, the bitline implant may be performed at a dosage of about $1E15/cm^2$ for a resulting concentration of about $2E20/cm^3$, for example. The first poly 616 and ONO 608 layers block the implant 660, and the bitlines 662 are accordingly formed to a width 666 that corresponds substantially to that 636 of the bitline openings 634. This width 666 can be about 70 nanometers, for example (FIG. 4) due, at least in part, to the use of the sidewall spacers 632 (FIG. 12).

Figure 15C:
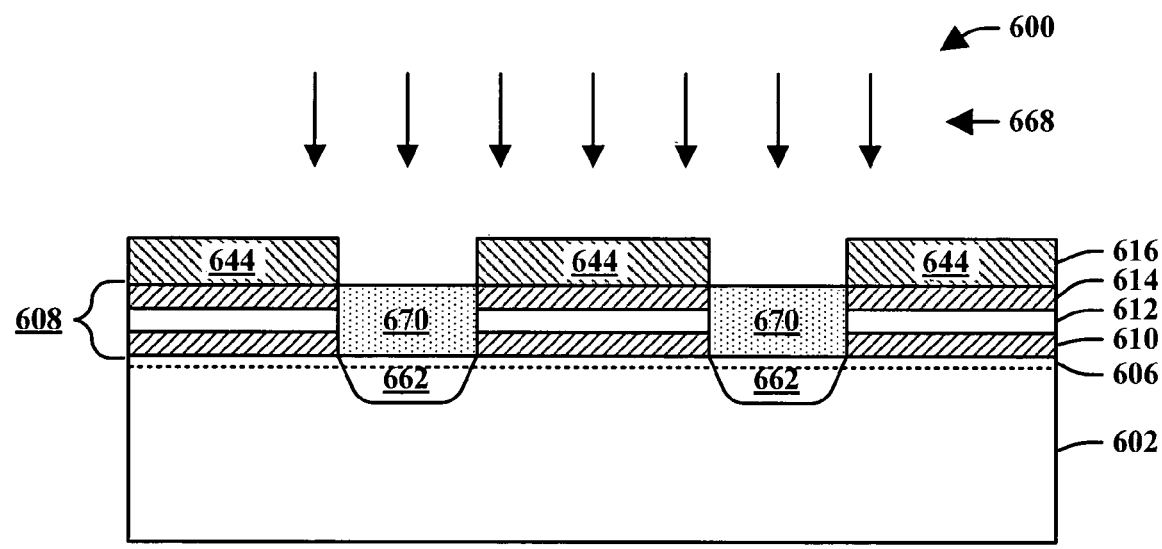

A high temperature oxide deposition 668 can then be performed to fill the respective spacings 650 formed within the charge trapping dielectric layer 608 with an oxide based material 670 (FIG. 15C). The high temperature oxide deposition can be performed at temperatures between around 700 to 1200 degrees Celsius, for example. The high temperature oxide deposition causes oxide growth over the respective bitlines 662 while also depositing oxide over the buried bitlines. In one example, about 100 Angstroms of an oxide is grown, while an additional approximately 100 Angstroms of an oxide is deposited over the bitlines 662.

Figure 16A:
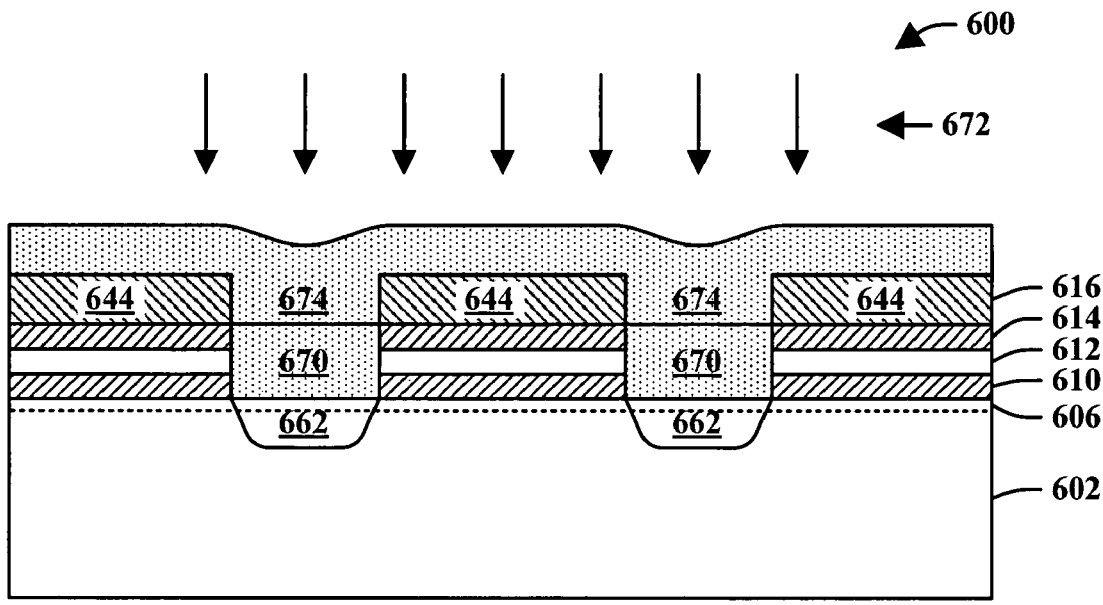
Figure 16B:
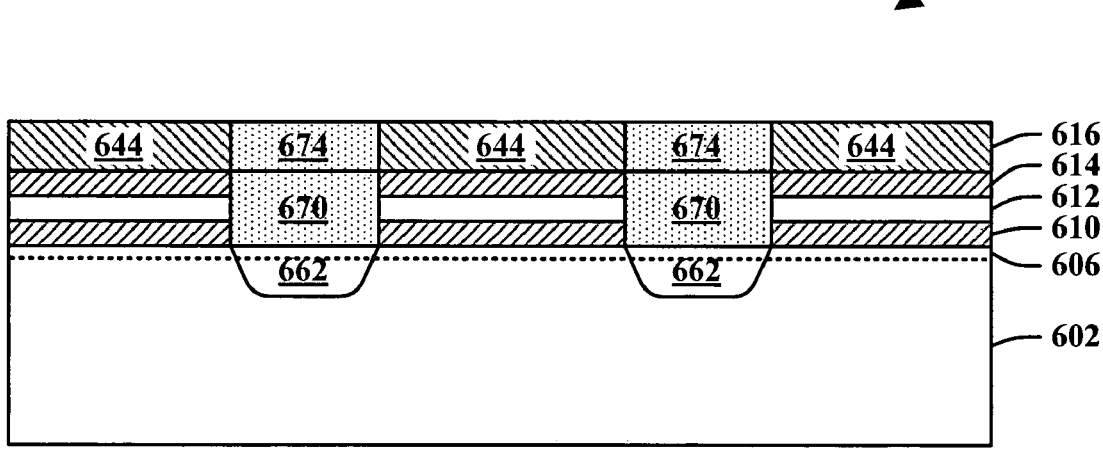

A high density plasma (HDP) deposition 672 is then performed to fill the respective spacings 640 formed within the first poly layer 616 with an oxide material 674 (FIG. 16A). The HDP deposition 672 can, for example, be performed at a temperature of about 300° C. to about 700° C. and under a pressure of about 1-10 mTorr to fill in the first poly spacings 640. The entire wafer can then be subjected to chemical mechanical polishing (CMP) to remove any excess oxide material 674 and planarize the surface of the structures thereon (FIG. 16B). It will be appreciated that in a three dimensional perspective this results in "strips" of oxide material 674 in parallel with the patterned strips 644 of the first poly material 616.

Figure 16C:
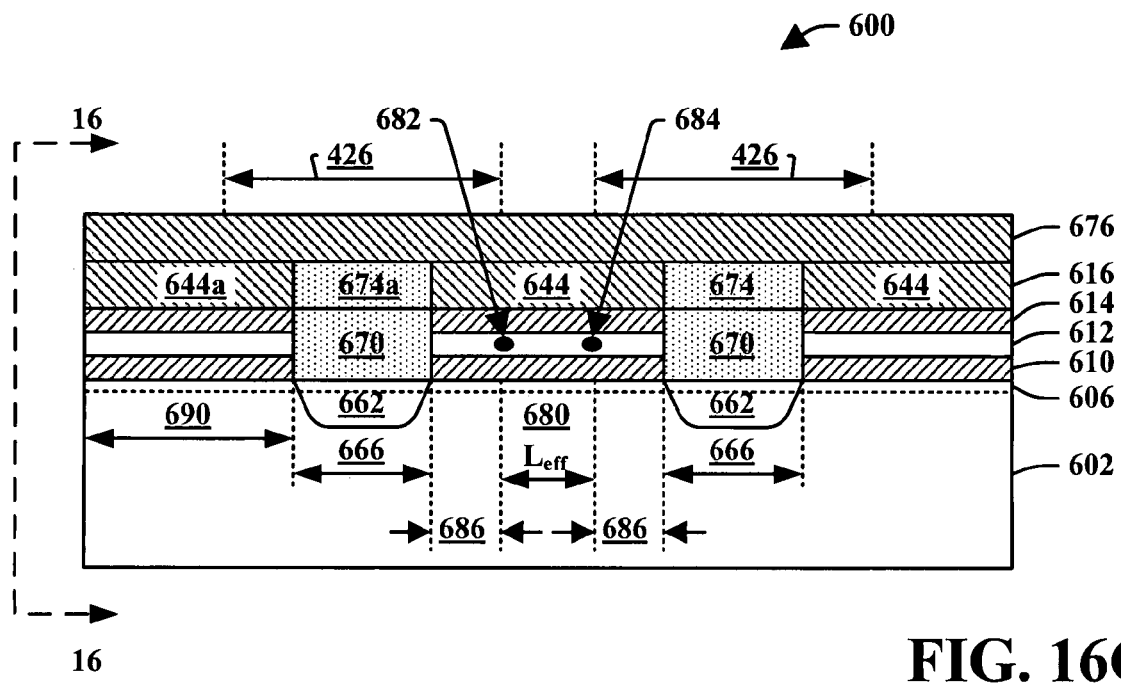
Figure 17:
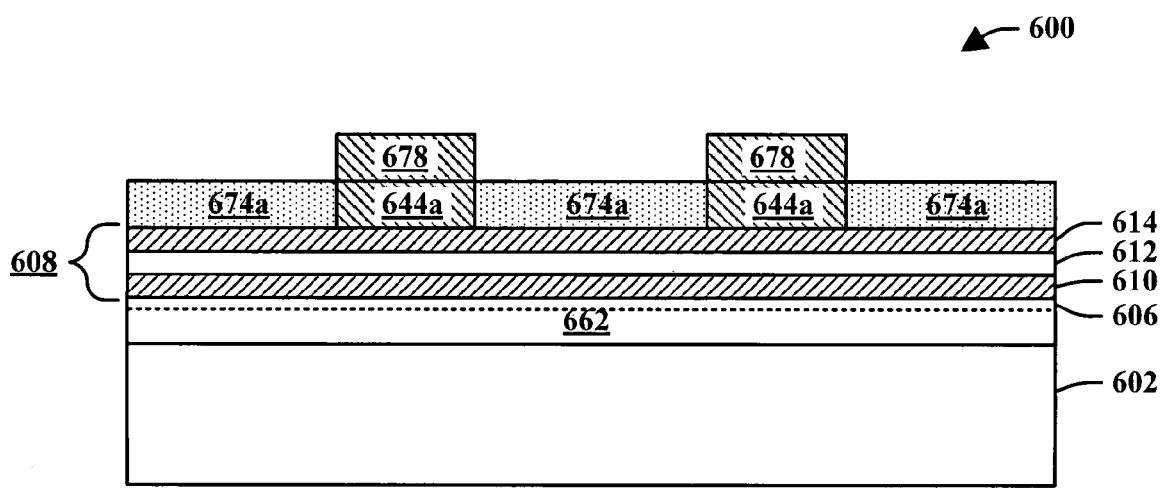

A second layer of poly-2 based material(s) 676 can then be formed over the first poly-1 layer 616 (FIG. 16C). As with the poly-1 layer 616, this poly-2 layer 676 can be formed to thickness of between about 900 to 1100 Angstroms, for example. The poly-2 layer 676 can serve as a wordline material and as such can be patterned into wordlines. Accordingly, the poly-2 layer 676 can then be patterned to establish wordlines 678 over the buried bitlines 662 (FIG. 17). It will be appreciated that the wordlines 678 are formed so as to be oriented at approximately 90 degrees relative to the bitlines 662. This "crossed" orientation allows individual memory cells to be addressed. The illustration depicted in FIG. 17 is accordingly rotated approximately 90 degrees relative to the images illustrated in FIGS. 6-16C. As such, a side view or view along the length of a buried bitline 662 is illustrated in FIG. 17. FIG. 17 can also be thought of as a view into FIG. 16C along lines 16-16 with the poly-2 layer 676 patterned into the wordlines 678.

It will be appreciated that since the buried bitlines 662 are substantially parallel to the "strips" 644 of the patterned poly-1 layer 616 as well as the "strips" 674 of oxide material deposited between strips 644, the patterned wordlines 678 are also substantially perpendicular to strips 644, 674. Accordingly, since the wordlines 678 lie immediately over these strips 644, 674, the wordlines may be shorted together by the underlying strips 644 of the patterned first poly layer 616 if these strips 644 are not patterned so as to electrically isolate the overlying wordlines 678 from one another. As such, when the poly-2 layer 676 is patterned to form the wordlines 678, this process continues until underlying portions of the strips 644 between the wordlines 678 are also removed (e.g., to expose the second insulating layer 614). Accordingly, the portions of the strip of oxide material 674a visible in FIG. 17 is revealed by the removed portions of the strip 644a of the first poly layer 616. As such, these visible portions of strip 674a can be set back from the remaining portions of strip 644a by a distance substantially equal to the width 690 of strip 644a (FIG. 17).

Figure 18:
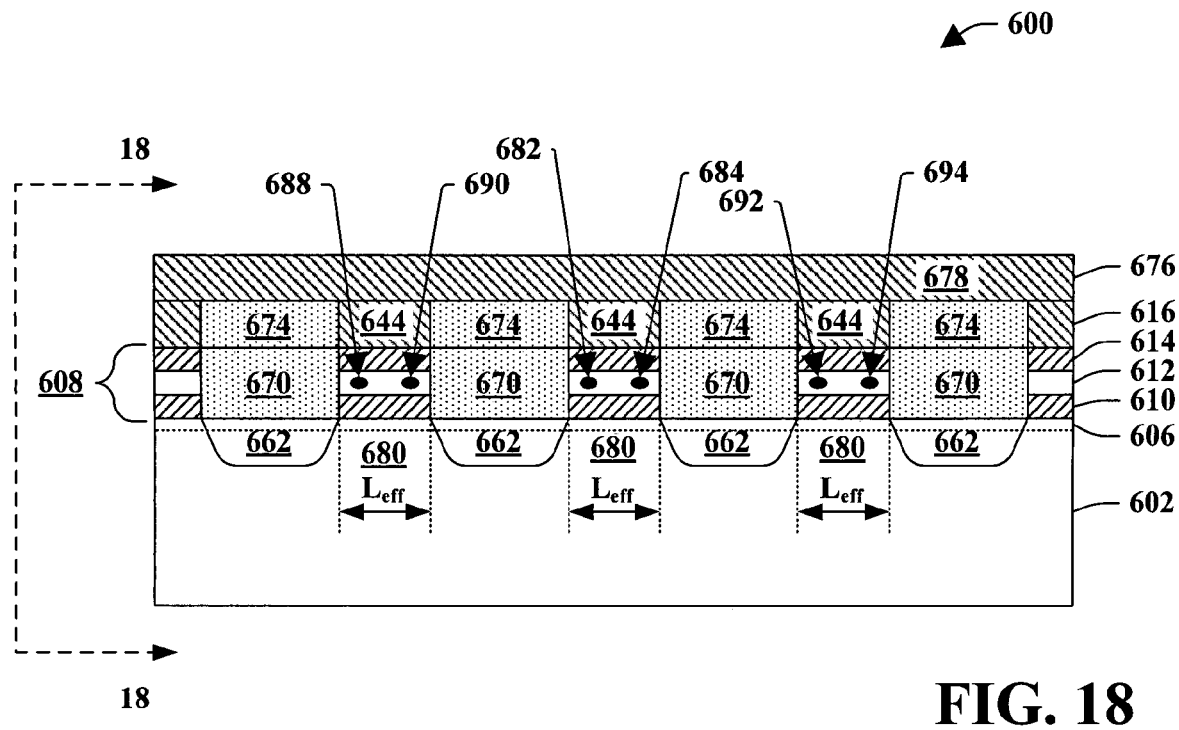

Referring to FIG. 18, it will be appreciated that the buried bitlines 662 can serve as source and drain regions of the transistor or memory cell 600, and a channel 680 can be defined between these regions. The channel 680 underlies a gate of the transistor, where wordlines generally serve as the gates of transistors operating as memory devices. When a voltage of a sufficient magnitude (e.g., a threshold voltage (Vt)) is applied to the gate of the transistor, electric fields generated within the transistor allow currents to flow between the source and drain regions. This allows charges 682, 684 (which correspond to bits of data) to be stored (programmed) within and/or erased from the charge trapping layer 612. It will be appreciated that dual charges or bits are discussed herein as one or more aspects of the present invention have application to dual bit memory cells.

As scaling occurs, however, and channel lengths are correspondingly decreased, the threshold voltage Vt can change. For example, as source and drain regions are brought closer together, smaller and smaller voltages are needed to program and/or erase bits of data. This can promote Vt roll-off and lead to data being unintentionally erased and/or programmed. The shallower bitlines 662, however, serve to mitigate Vt roll-off, thereby providing more predictability as to when data will be programmed and/or erased from the cell 600. Additionally, the oxide regions 670, 674 overlying the bitlines 662 serve to maintain and/or increase a breakdown voltage between the bitlines 662 and the wordlines 678 (e.g., from a more conventional 16V to around 25V). In this manner the transistor 600 exhibits more predictable performance as compared to conventional devices.

Figure 19:
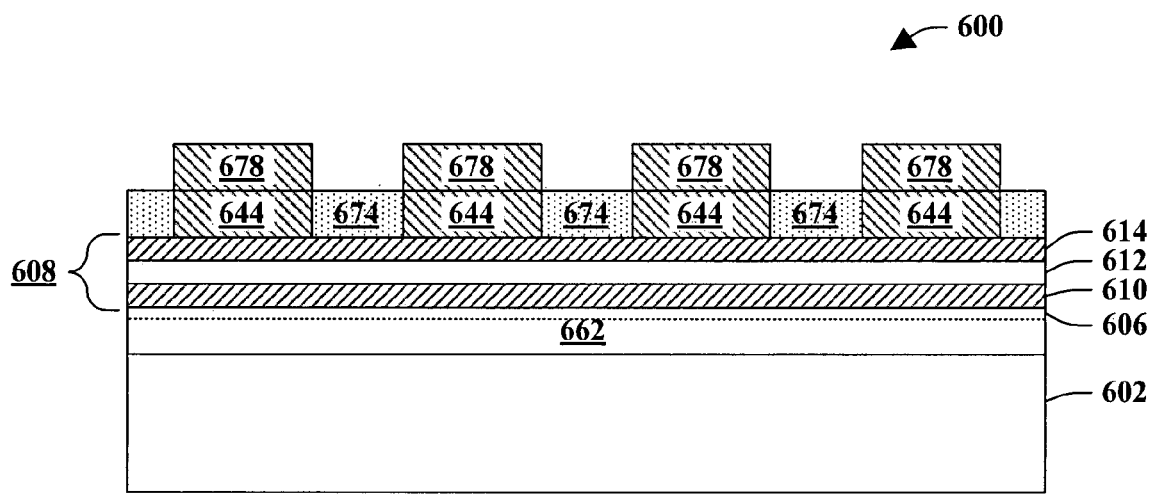
Figure 20:
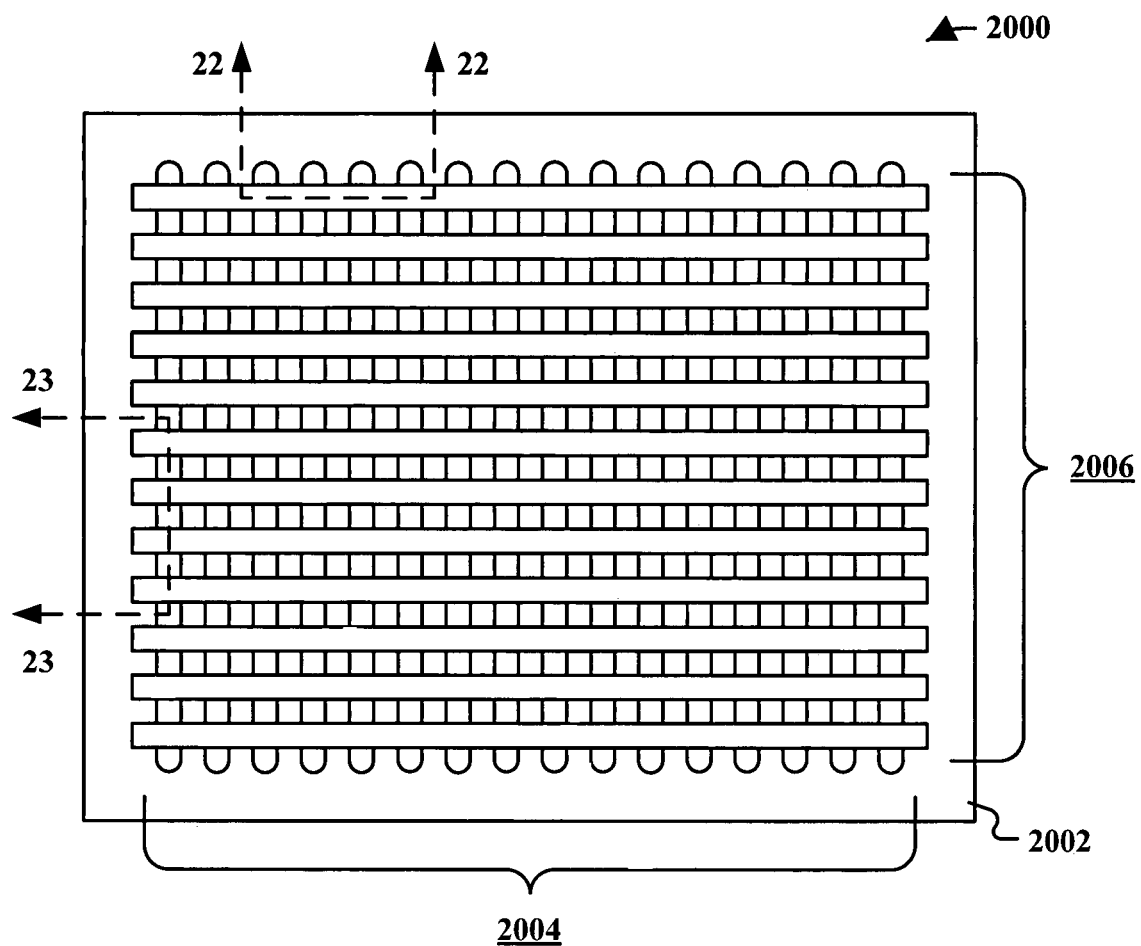

It will be appreciated that given the substantially perpendicular orientation between the bitlines and the wordlines, a view along the length of the wordline is depicted in FIG. 19. FIG. 19 illustrates the patterned wordlines 678 in the format set forth with respect to FIG. 18, but rotated by about ninety degrees or looking in lines 18-18 of FIG. 18. FIG. 19 is similar to FIG. 17 in that it illustrates the patterned wordlines 678 and is rotated by about 90 degrees relative to corresponding FIG. 19. However, the device depicted in FIG. 19 has more storage capability than the device of FIG. 17. Similarly, FIG. 20 is akin to FIG. 3 in that it illustrates a top view of at least a portion 2400 of a memory core, such as may include at least part of one of the M by N array cores 104 depicted in FIG. 1. Nevertheless, the memory 2000 is condensed in FIG. 20 in accordance with one or more aspects of the present invention.

The memory 2000 is formed upon a semiconductor substrate 2002 and has a plurality of implanted bitlines 2004 extending substantially parallel to one another, and further includes a plurality of wordlines 2006 formed over the buried bitlines 2004. The wordlines 2006 extend substantially parallel to one another and at substantially right angles relative to the plurality of implanted bitlines 2004. It will be appreciated that the wordlines 2006 and bitlines 2004 have contacts and interconnections (not shown) to programming circuitry such as may be represented, at least in part, by the x-decoders 108 and y-decoders 110 depicted in FIG. 1. It will also be appreciated that FIG. 18 may, for example, correspond to that which is depicted in FIG. 20 taken along lines 22-22, while FIG. 19 may correspond to that which is depicted in FIG. 20 taken along lines 23-23, for example.

Figure 21:
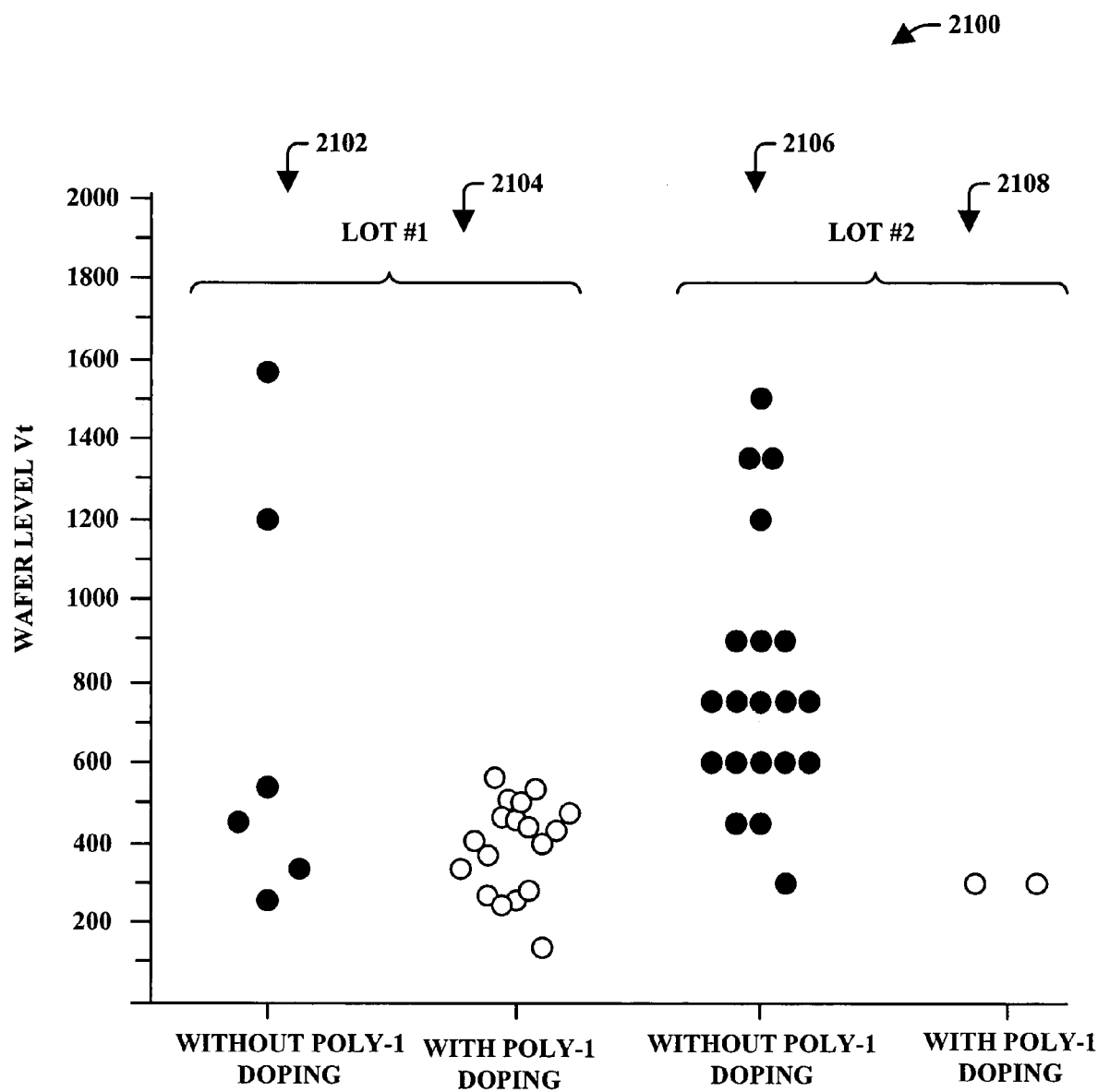
FIG. 21 is a graph of the variation in Vt with respect to poly-1 doping, according to yet another aspect of the present invention.

Referring to FIG. 21, in one embodiment of the present invention, is a graph at 2100 that illustrates representative Vt data (Vt at a fixed transistor current, at the end of processing) that was obtained, comparing two lots of Vt data. The graph illustrates the variation in Vt, as a range of Vt for each wafer is plotted on a y-axis, while lot 1 and lot 2 with and without doping is plotted on the x-axis. The graph 2100 includes four different exemplary groupings of data points 2102, 2104, 2106 and 2108 corresponding to differing threshold voltages (Vt), for example. The first curve 2102 was obtained for lot 1 by measuring and plotting the threshold voltage without doping the poly-1 layer. The second curve 2104 is representative data plotted based on doping the poly-1 layer of lot 1 and plotting the Vt values. The third curve 1206 represents Vt data plotted on the curve, based on an undoped poly-1 layer of lot 2. Finally, the forth curve 2108 shows Vt data for lot 2 for a poly-1 doped layer.

For example, it can be seen in the curve 2102, wherein wafer level threshold voltage varies from 200 mV to 1600 mV over the entire range, whereas the Vt data in graph 2104 is more consistent and only varies by 100 mV to 600 mV. Again, the data for graphs 2106 and 2108 indicates a similar pattern. The undoped Poly-1 layer indicates a wide range of threshold voltage (up to 1600 mV) and in contrast the doped Poly-1 layer shows a tighter distribution of Vt (up to 600 mV). It is apparent from this data that the doping of the Poly-1 layer results in a more consistent threshold voltage.

Figure 22:
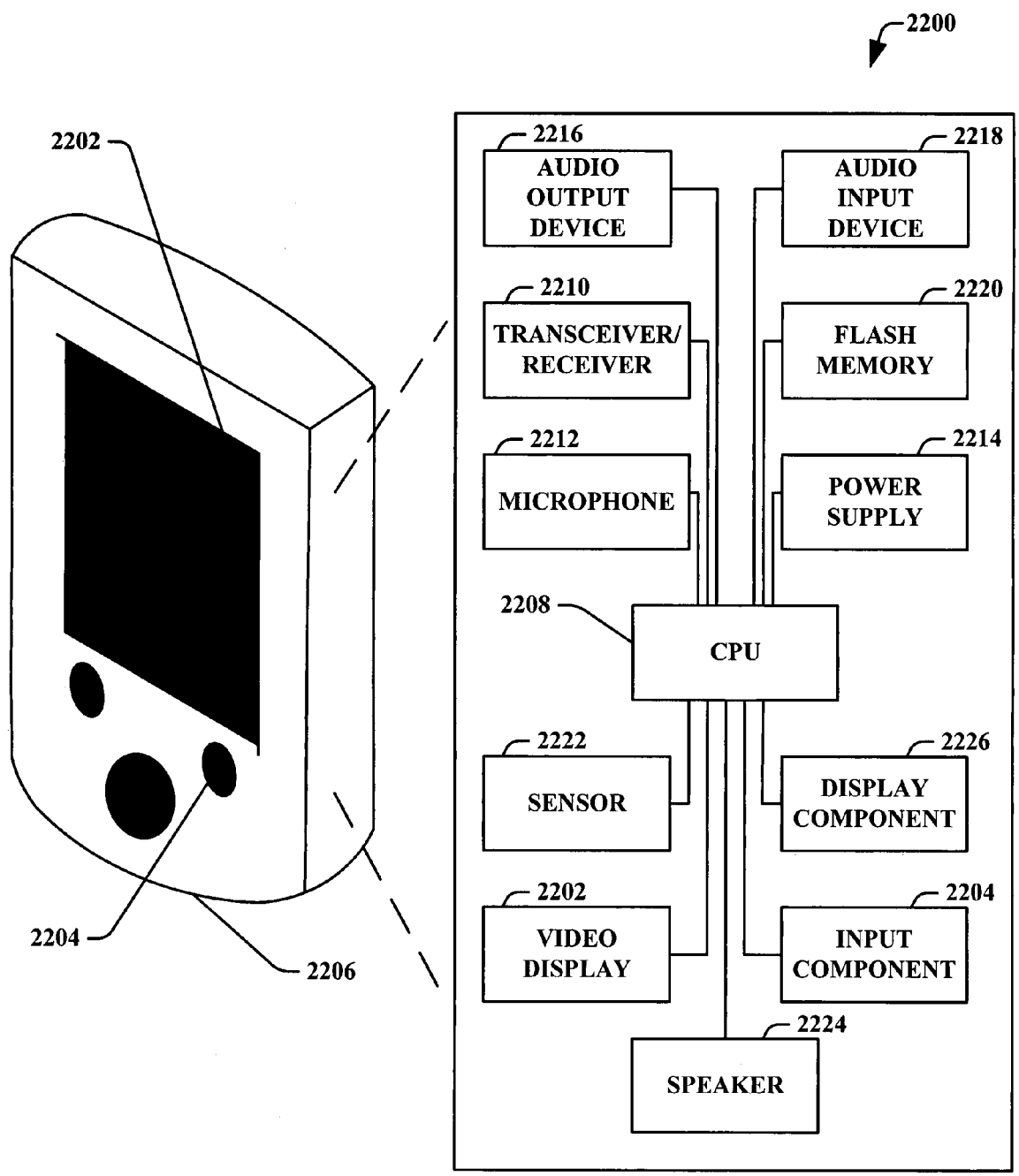
FIG. 22 is an isometric view of a device and block diagram according to yet one or more aspects of the present invention.

FIG. 22 is an exemplary portable electronic device, for example, a Personal Data Assistant (PDA) 2200 comprising a video display 2202, an input component 2204, a housing 2206, a CPU 2208, a transceiver and/or a receiver 2210, a microphone 2212, a power supply 2214, an audio output device 2216, an audio input 2218, flash memory 2220, various sensors 2222, and speaker(s) 2224. The flash memory 2220 manufactured according to using implanted poly-1 to improve charge protection in a dual-poly process, according to an aspect of the present invention. The audio input device 2218 can be a transducer, for example. The input component 2204 can include a keypad, buttons, dials, pressure keys, and the like. The video display 2202 can be a liquid crystal display, a plasma display, an LED display, and the like, for displaying visual data and information. In accordance with another embodiment of the claimed subject matter, the portable device with flash memory 2220 manufactured according to a thick spacer for BL implant and then remove method, of the present invention, comprises cell phones, memory sticks, flash drive devices, video camcorders, voice recorders, USB flash drives, fax machines, flash memory laptops, MP3 players, digital cameras, home video game consoles, hard drives, memory cards (used as solid-state disks in laptops), and the like. The flash memory 2220 can include random access memory, read only memory, optical memory, audio memory, magnetic memory, and the like.

According to one embodiment of the present invention, the CPU 2208 is configured to communicate with the audio input device 2218, the audio output device 2216 and a display component 2226. The display component 2226 can be separate and distinct from the video display 2202. The CPU 2208 can execute control functions based on inputs from the user, entered using the input component 2204, for example. Based on those inputs, for example the display component can display a graph, a photo, a map, a chart, a video, and the like. The PDA 2200 is also configured to output data as an audio signal, for example a song, a message, a warning sound, various tones, recordings, etc. In another embodiment of the present invention the PDA 2200 can communicate with other electronic devices, for example computers, cell phones, other PDAs, and the like. The PDA 2200 is also configured to transmit digital data wirelessly from one user to another. This is done utilizing the transmitter/receiver 2210 to either transmit or receive data. Additionally, sensors 2222 can be utilized to sense data external to the PDA 2200, for example, temperatures, radiation levels, pressures, and the like. It will be further appreciated that any of the layers described herein can be formed in any one or more suitable manners, either alone or in combination, such as with spin-on techniques, sputtering techniques (e.g., magnetron or ion beam sputtering), growth and/or deposition techniques such as chemical vapor deposition (CVD) and/or low pressure chemical vapor deposition (LPCVD), for example.

FIG. 15 is an exemplary portable electronic device, for example, a Personal Data Assistant (PDA) 1500 comprising a video display 1502, an input component 1504, a housing 1506, a CPU 1508, a transceiver and/or a receiver 1510, a microphone 1512, a power supply 1514, an audio output device 1516, an audio input 1518, flash memory 1520, various sensors 1522, and speaker(s) 1524. The flash memory 1520 manufactured according to a thin oxide dummy tiling discharge protection method, of the present invention. The audio input device 1518 can be a transducer, for example. The input component 1504 can include a keypad, buttons, dials, pressure keys, and the like. The video display 1502 can be a liquid crystal display, a plasma display, an LED display, and the like, for displaying visual data and information. In accordance with another embodiment of the claimed subject matter, the portable device with flash memory 1520 manufactured according to a thin oxide dummy tiling discharge protection method, of the present invention, comprises cell phones, memory sticks, flash drive devices, video camcorders, voice recorders, USB flash drives, fax machines, flash memory laptops, MP3 players, digital cameras, home video game consoles, hard drives, memory cards (used as solid-state disks in laptops), and the like. The flash memory 1520 can include random access memory, read only memory, optical memory, audio memory, magnetic memory, and the like.

According to one embodiment of the present invention, the CPU 1508 is configured to communicate with the audio input device 1518, the audio output device 1516 and a display component 1526. The display component 1526 can be separate and distinct from the video display 1502. The CPU 1508 can execute control functions based on inputs from the user, entered using the input component 1504, for example. Based on those inputs, for example the display component can display a graph, a photo, a map, a chart, a video, and the like. The PDA 1500 is also configured to output data as an audio signal, for example a song, a message, a warning sound, various tones, recordings, etc. In another embodiment of the present invention the PDA 1500 can communicate with other electronic devices, for example computers, cell phones, other PDAs, and the like. The PDA 1500 is also configured to transmit digital data wirelessly from one user to another. This is done utilizing the transmitter/receiver 1510 to either transmit or receive data. Additionally, sensors 1522 can be utilized to sense data external to the PDA 1500, for example, temperatures, radiation levels, pressures, and the like Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming at least a portion of a dual-poly memory core array upon a semiconductor substrate, the method comprising:

forming a charge trapping dielectric layer over the semiconductor substrate;

forming a first polysilicon layer over the charge trapping dielectric layer;

patterning the first polysilicon layer to expose bitline areas in the semiconductor substrate;

doping of the first polysilicon layer layer before patterning the first polysilicon layer;

performing bitline implant over the patterned first polysilicon layer and in the bitline areas of the semiconductor substrate;

forming a second polysilicon layer over and electrically contacting the patterned first polysilicon layer; and performing back end processing.

2. The method of claim 1, further comprising forming a hardmask and patterning the hardmask subsequent to the doping of the first polysilicon layer.

3. The method of claim 1, wherein the first polysilicon layer is formed to a thickness of between about 500 to 1000 Angstroms.

4. The method of claim 1, wherein the second polysilicon layer is formed to a thickness of between about 900 and 1100 Angstroms.

5. The method of claim 1, wherein the first polysilicon layer doping includes an n-type dopant.

6. The method of claim 1, wherein the first polysilicon layer doping is performed at an energy level of around 5 KeV to 15 KeV.

7. The method of claim 1, wherein the first polysilicon layer doping is performed at a dose of about $1E14/cm^2$ to $1E15/cm^2$.

8. The method of claim 1, wherein the first polysilicon layer doping has a resulting dopant concentration of about $2E20/cm^3$ or less.

9. A method of forming at least a portion of a dual-poly flash memory cell arrangement upon a semiconductor substrate, the method comprising:

forming a charge trapping dielectric layer over the semiconductor substrate;

forming a first polysilicon layer over the charge trapping dielectric layer;

patterning the first polysilicon layer to form a plurality of memory cell gates and expose bitline areas in the semiconductor substrate;

doping the first polysilicon layer before patterning the first polysilicon layer;

performing a bitline implant over the patterned first polysilicon layer and in the bitline areas of the semiconductor substrate;

filling the bitline areas between portions of the patterned first polysilicon layer with a dielectric material; and forming a patterned second polysilicon layer extending over and transverse to the patterned first polysilicon layer, and making electrical contact to the patterned first polysilicon layer, thereby electrically courling together the plurality of memory cell gates along a wordline.

10. The method of claim 9, wherein the first polysilicon layer is formed to a thickness of between about 500 to 1000 Angstroms.

11. The method of claim 9, wherein the second polysilicon layer is formed to a thickness of between about 900 to 1100 Angstroms.

12. The method of claim 9, wherein the first polysilicon layer dosing is performed at a dosage of about $1E15/cm^2$.

13. The method of claim 9, wherein the first polysilicon layer has a resulting dopant concentration of about $2E20/cm^3$.

14. The method of claim 9, wherein the first polysilicon layer doping includes an n-type dopant.

15. The method of claim 9, wherein a bitline implant is performed at an energy level of about 10KeV to 40KeV.

* * * * *